(12) United States Patent
Lee et al.

(10) Patent No.: US 11,948,947 B2
(45) Date of Patent: Apr. 2, 2024

(54) DISPLAY DEVICE

(71) Applicant: SAMSUNG DISPLAY CO., LTD., Yongin-si (KR)

(72) Inventors: Kwang Soo Lee, Gwangmyeong-si (KR); Hyun Kim, Suwon-si (KR); Kap Soo Yoon, Seoul (KR); Su Jung Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 353 days.

(21) Appl. No.: 16/896,513

(22) Filed: Jun. 9, 2020

(65) Prior Publication Data
US 2021/0036032 A1 Feb. 4, 2021

(30) Foreign Application Priority Data
Jul. 30, 2019 (KR) .......................... 10-2019-0092385

(51) Int. Cl.
*H01L 27/12* (2006.01)
(52) U.S. Cl.
CPC ........ *H01L 27/1251* (2013.01); *H01L 27/124* (2013.01); *H01L 27/1288* (2013.01)
(58) Field of Classification Search
CPC ............... H01L 27/1251; H01L 27/124; H01L 27/1288
See application file for complete search history.

(56) References Cited

U.S. PATENT DOCUMENTS

| 9,035,296 | B2 | 5/2015 | Jung et al. |
| 9,184,417 | B2 | 11/2015 | Oh et al. |
| 9,455,333 | B2 | 9/2016 | Lee et al. |
| 2009/0140270 | A1* | 6/2009 | Takahashi ........... H01L 27/1266 257/E27.06 |
| 2011/0168993 | A1 | 7/2011 | Jeon et al. |
| 2012/0119322 | A1* | 5/2012 | Tada ................. G02F 1/136209 257/532 |
| 2017/0330938 | A1 | 11/2017 | Baeck et al. |
| 2018/0350848 | A1 | 12/2018 | Shin et al. |
| 2019/0081183 | A1* | 3/2019 | Li ........................ H01L 29/7869 |
| 2019/0302921 | A1* | 10/2019 | Chen ...................... G06F 3/0446 |

* cited by examiner

*Primary Examiner* — Trang Q Tran
(74) *Attorney, Agent, or Firm* — F. Chau & Associates, LLC

(57) ABSTRACT

A display device includes pixel circuits disposed in a display area and a driving circuit disposed in the peripheral area. The driving circuit includes a first transistor and each pixel circuit includes a second transistor. The first transistor includes a first active pattern disposed on the substrate, a first gate insulation layer having a first outer portion disposed on the first active pattern, and a first gate electrode disposed on the first gate insulation layer. The second transistor includes a second active pattern disposed on the substrate, a second gate insulation layer having a second outer portion disposed on the second active pattern, and a second gate electrode disposed on the second gate insulation layer. The first outer portion doesn't overlap the first gate electrode and has a first width. The second outer portion doesn't overlap the second gate electrode and has a second width smaller than the first width.

20 Claims, 30 Drawing Sheets

DISPLAY DEVICE

CROSS-REFERENCE TO RELATED APPLICATION

This U.S. non-provisional patent application claims priority 35 U.S.C. § 119 to Korean Patent Application No. 10-2019-0092385 filed in the Korean Intellectual Property Office on Jul. 30, 2019, the disclosure of which is incorporated by reference in its entirety herein.

BACKGROUND

(a) Technical Field

The present disclosure relates to a display device.

(b) Discussion of Related Art

A display device such as a liquid crystal display (LCD) and an organic light emitting diode (OLED) display includes a display panel including a display area and a peripheral area. The display area is an area where an image can be displayed.

In the display area, there are a plurality of pixels which are units for displaying an image, and a plurality of signal lines. The plurality of signal lines may include a gate line and a data line. Each pixel may include a pixel circuit portion including at least one pixel transistor, and a display portion connected to each pixel circuit portion. The pixel circuit portion may include at least one pixel transistor connected with a data line and a gate line, and the display portion may include a pixel electrode for receiving a data signal from the pixel circuit portion.

The peripheral area may include a driving circuit portion and a plurality of voltage lines connected with a plurality of signal lines to which a driving signal can be applied. The driving circuit portion includes a plurality of driving transistors.

SUMMARY

At least one embodiment of the present disclosure has been made in an effort to provide a display device having a driving circuit portion that can stably operate without deterioration of a driving transistor of the driving circuit portion when subjected to a very high voltage.

A display device according to an exemplary embodiment of the present invention includes: a substrate having a display area and a peripheral area surrounding the display area; a plurality of pixel circuit portions and a plurality of signal lines disposed in the display area; and a driving circuit portion disposed in the peripheral area and connected with the plurality of signal lines. The driving circuit portion includes a first transistor having a first active pattern disposed on the substrate, a first gate insulation layer disposed on the first active pattern, a first gate electrode disposed on the first gate insulation layer. Each pixel circuit portion includes a second transistor having a second active pattern disposed on the substrate, a second gate insulation layer disposed on the second active pattern, and a second gate electrode disposed on the second gate insulation layer. The first gate insulation layer includes a first outer portion that does not overlap the first gate electrode in a first direction. The second gate insulation layer includes a second outer portion that does not overlap the second gate electrode in the first direction. A first width of the first outer portion in a second other direction is larger than a second width of the second outer portion in the second direction.

A display device according to an exemplary embodiment of the present invention includes: a substrate having a display area and a peripheral area surrounding the display area; a plurality of pixel circuit portions and a plurality of signal lines disposed in the display area; and a driving circuit portion disposed in the peripheral area and connected with the plurality of signal lines. The driving circuit portion includes a first transistor having a first active pattern disposed on the substrate, a first gate insulation layer disposed on the first active pattern, and a first gate electrode disposed on the first gate insulation layer. The first gate insulation layer includes a first outer portion that does not overlap the first gate electrode in a first direction, and the first outer portion includes portions having different widths in a second other direction.

A display device according to an exemplary embodiment of the present invention includes: a substrate having a display area and a peripheral area surrounding the display area; a plurality of pixel circuit portions and a plurality of signal lines disposed in the display area; and a driving circuit portion disposed in the peripheral area and connected with the plurality of signal lines. The driving circuit portion includes a first transistor having a first active pattern disposed on the substrate, a first gate insulation layer disposed on the first active pattern, a first gate electrode disposed on the first gate insulation layer, a dummy insulation layer spaced apart from the first gate insulation layer, and a dummy electrode disposed on the dummy insulation layer and spaced apart from the first gate electrode. The dummy electrode includes a same material as the first gate electrode and has a width that is smaller than a width of the first gate electrode. The dummy insulation layer includes a same material as the first gate insulation layer and has a width that is smaller than a width of the first gate insulation layer.

A method for manufacturing a display device according to an exemplary embodiment of the present invention, includes: forming a first insulation layer on a substrate including a display area and a peripheral area surrounding the display area; forming a first active pattern in the peripheral area on the first insulation layer and a second active pattern in the display area on the first insulation layer; forming a second insulation layer on the active patterns; forming a conductive layer on the second insulation layer; forming a photoresist layer on the conductive layer; applying light to the photoresist layer through a photomask; exposing the photoresist layer in a developing solution to generate a first mask pattern in the peripheral area and a second mask pattern in the display area; etching the conductive layer using the first mask pattern and the second mask pattern as masks to generate a first gate electrode in the peripheral area and a second gate electrode; and etching the second insulation layer using the first mask pattern and the second mask pattern as masks to generate a first gate insulation layer in the peripheral area and a second gate insulation layer in the display area.

DETAILED DESCRIPTION OF THE EXEMPLARY EMBODIMENTS

Figure 1:
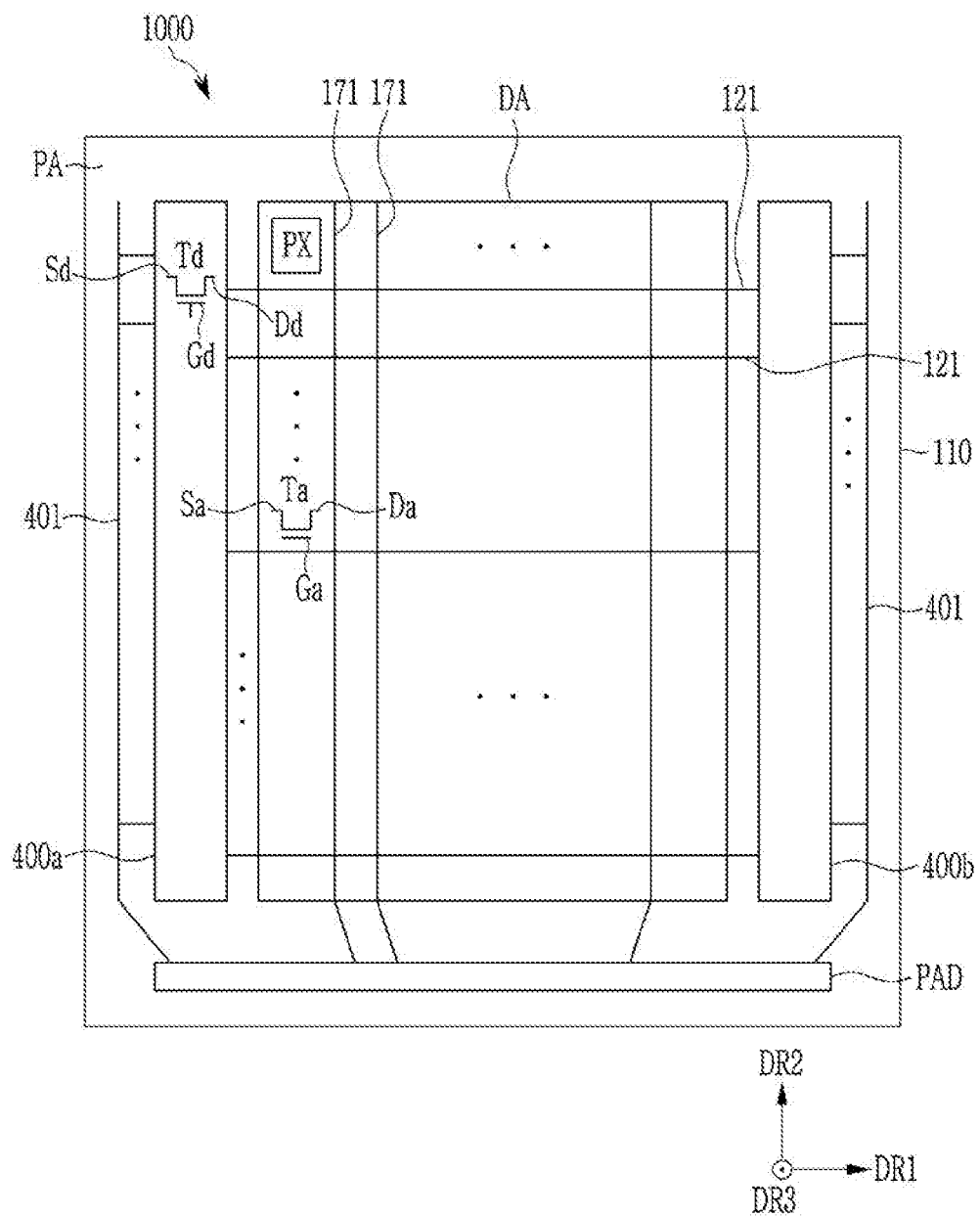
FIG. 1 is a planar layout view of a display device according to an exemplary embodiment of the present invention.

In the following detailed description, exemplary embodiments of the present invention have been shown and described. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

It will be understood that when an element such as a layer, film, region, or substrate is referred to as being "on" another element, it can be directly on the other element or intervening elements may also be present.

In the entire specification, the term "in a plan view" means a view (also referred to as a plane view) for observing a plane parallel to two intersecting directions (e.g. a first direction DR1 and a second direction DR2), and a cross-sectional view refers to a view for observing a plane cut in a direction perpendicular to a plane parallel to the first direction DR1 and the second direction DR2 (e.g., a third direction DR3). In addition, when two constituent elements overlap, unless otherwise indicated, the two constituent elements overlap in the third direction DR3 (e.g., in a direction perpendicular to the top surface of the substrate).

Referring to FIG. 1, a display device according to an exemplary embodiment of the present invention will be described.

FIG. 1 is a planar layout view of a display device according to an exemplary embodiment of the present invention.

Referring to FIG. 1, a display device 1000 according to an exemplary embodiment of the present invention includes a substrate 110 that includes a display area DA and a peripheral area PA around the display area DA.

The display area DA is an area where an image can be displayed, and includes a plurality of pixels PX and a plurality of signal lines including a plurality of gate lines 121 and a plurality of data lines 171.

Each pixel PX may include a pixel circuit portion (e.g., a pixel circuit) and a display portion (e.g., a display element). The pixel circuit portion includes at least one transistor Ta, and the display portion is connected to a pixel circuit portion of each pixel PX. The pixel circuit portions may be regularly arranged in the display area DA, and the display portions may be regularly arranged in the display area DA. For example, a regular arrangement could be created by setting each row of the display area DA to include an equal number of pixel circuit portion and display portion pairs that are equally spaced from one another. The display portions and the pixel circuit portions that correspond to each other may overlap each other or may not overlap each other in a plan view. The pixel circuit portion may include at least one pixel transistor Ta connected with data lines 171 and gate lines 121, and the display portion may include a pixel electrode that receives a data signal from the pixel circuit portion. The display portion may be, for example, a light emitting diode. The pixel transistor Ta includes a gate terminal Ga, a source terminal Sa, and a drain terminal Da. A detailed structure of the pixel circuit portion and the display portion will be described later in more detail.

Most or all of the peripheral area PA, unlike the display area DA, is a non-display area that does not display an image, but is not limited thereto. The peripheral area PA may include driving circuit portions 400a and 400b (e.g., driving circuits), a plurality of driving wires 401, and a pad portion PAD. For example, the pad portion PAD may include one or more conductive pads for receiving external voltages to be supplied to the driving wires 401 and/or for receiving data voltages to be supplied to the data lines 171.

The driving circuit portions 400a and 400b may be connected with a plurality of signal lines, for example, the plurality of gate lines 121 disposed in the display area DA, and apply a driving signal. For example, the driving circuit portions 400a and 400b may apply a gate signal sequentially to a plurality of the gate lines 121. The application of gate signals sequentially to the gate lines 121 may be referred to as scanning the gate lines. The driving circuit portions 400a and 400b may apply a gate signal to a gate terminal of the pixel transistor Ta connected to the gate line 121 of the pixel transistor Ta of the display area DA per row unit.

Although a driving circuit portion 400a and a driving circuit portion 400b are shown to be positioned at respective sides with reference to the display area DA, one of the two driving circuit portions 400a and 400b may be omitted. The driving circuit portions 400a and 400b may include a plurality of driving circuits that can output a gate signal, and each driving circuit includes at least one driving transistor Td. The driving transistor Td includes a gate terminal Gd, a source terminal Sd, and a drain terminal Dd. The plurality of driving circuits included in each of the driving circuit portions 400a and 400b may be arranged in a second direction DR2. For example, the driving transistors Td may be arranged in a first column in the driving circuit portion 400a and arranged in a second column in the driving circuit portion 400b. For example, each driving circuit may be configured to control a different subset of the gate lines 121.

The plurality of driving wires 401 may include portions extending substantially or precisely in a second direction DR2, and may be connected to the pad portion PAD. The driving wires 401 may include wires transmitting various voltages and signals for driving the driving circuit portions 400a and 400b and the pixel circuit portion, such as a plurality of voltage lines. The voltage lines may include a low voltage line transmitting a low voltage for generation of a gate signal, a high voltage line transmitting a high voltage for generation of a gate signal, a driving voltage line, and various clock signal lines. For example, the low voltage may be used to generate a gate-on voltage of the gate signal and the high voltage may be used to generate a gate-off voltage of the gate signal. The gate-on voltage may be used to turn on a transistor of a pixel circuit portion of a pixel PX to receive a data voltage from a data line 171 and the gate-off voltage may be used to turn off the transistor to prevent the pixel PX from receiving the data voltage. At least a portion of the driving wires 401 may be connected with the driving circuit portions 400a and 400b.

The pad portion PAD may be disposed near one edge of the substrate 110, in which the driving circuit portions 400a and 400b are not located. The plurality of data lines 171 may extend to the peripheral area PA and thus may be connected with the pad portion PAD. The display device 1000 according to an exemplary embodiment of the present invention may further include at least one of a flexible printed circuit film, a driving circuit chip, and a printed circuit board connected to the pad portion PAD. The plurality of data lines 171 may receive a data signal through the pad portion PAD.

Driving transistors Td of the driving circuit portions 400a and 400b may be formed together through a same process on the same substrate 110 as a pixel transistor Ta of the pixel circuit portion disposed in the display area DA.

Referring to FIG. 2 to FIG. 5, together with FIG. 1, detailed structures of the pixel transistor Ta disposed in each pixel PX of the display area DA and the driving transistors Td included in the driving circuit portions 400a and 400b of the peripheral area PA will now be described.

Figure 2:
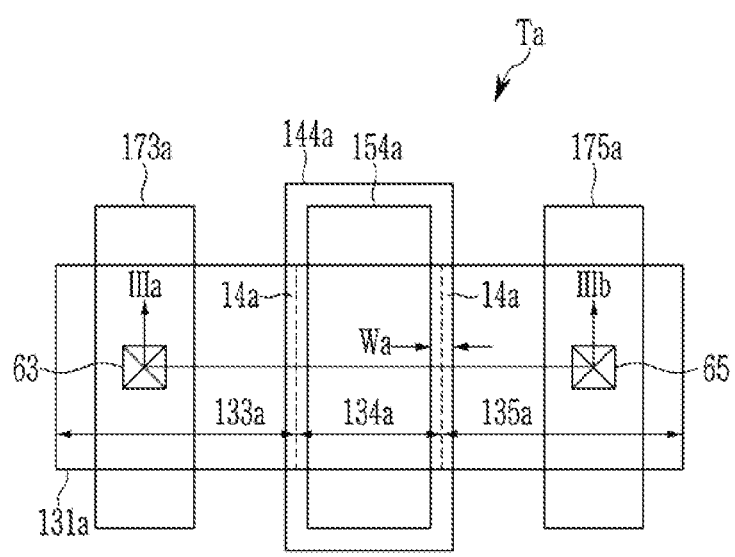
FIG. 2 is a top plan view of a pixel transistor included in a pixel circuit portion of the display device according to an exemplary embodiment of the present invention.
Figure 3:
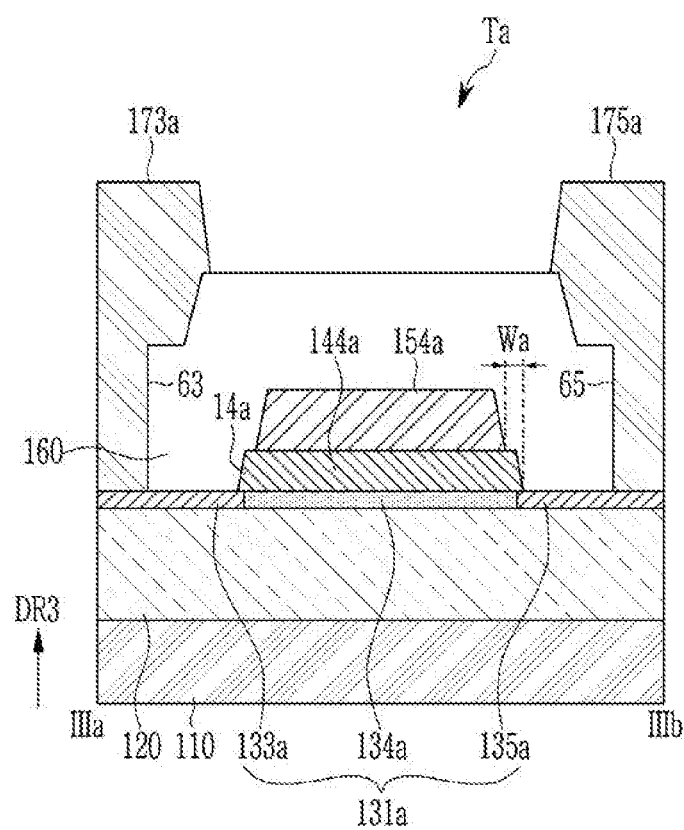
FIG. 3 is a cross-sectional view of the display device of FIG. 2, taken along line IIIa-IIIb.
Figure 4:
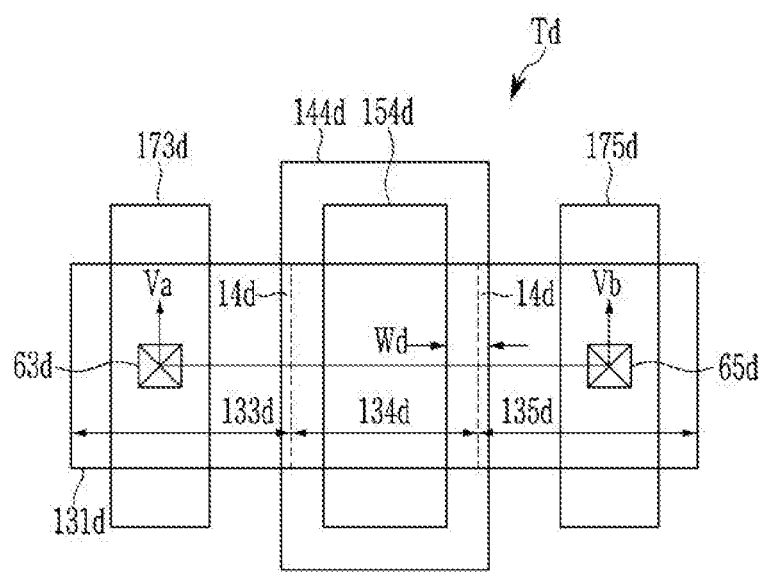
FIG. 4 is a top plan view of a driving transistor included in a driving circuit portion of the display device according to an exemplary embodiment of the present invention.
Figure 5:
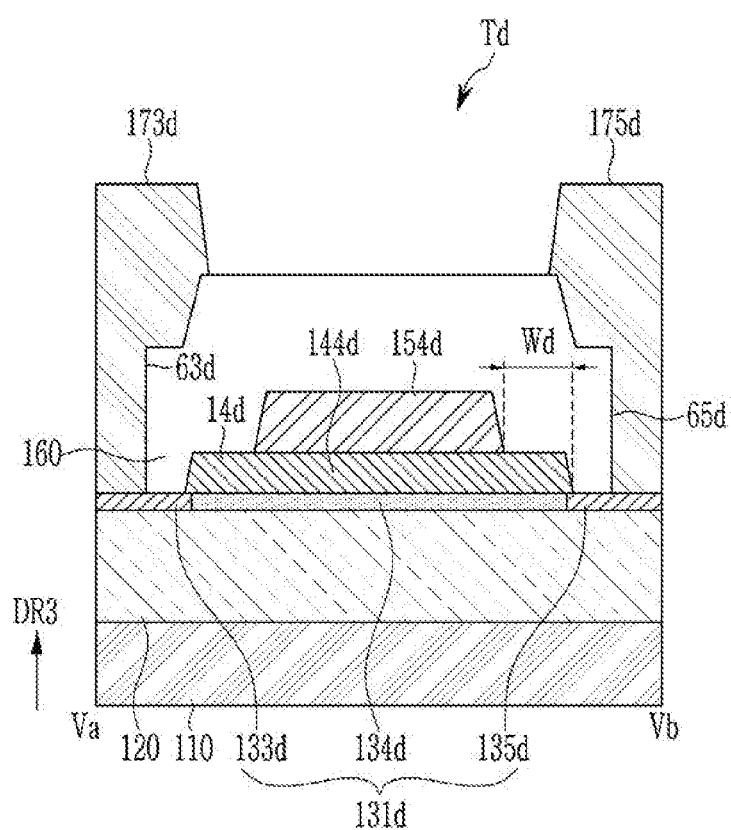
FIG. 5 is a cross-sectional view of the display device of FIG. 4, taken along line Va-Vb.

FIG. 2 is a top plan view of a pixel transistor Ta included in a pixel circuit portion of the display device, FIG. 3 is a cross-sectional view of the display device of FIG. 2, taken along line IIIa-IIIb, FIG. 4 is a top plan view of a driving transistor Td included in a driving circuit portion of the display device according to an exemplary embodiment of the present invention, and FIG. 5 is a cross-sectional view of the display device shown in FIG. 4, taken along line Va-Vb.

A buffer layer 120, which is an insulation layer, may be disposed on the substrate 110. The substrate 110 may include an insulation material such as glass or plastic, and may have flexibility.

Active patterns 131a and 131d are disposed on the buffer layer 120. The active pattern 131a is disposed on the pixel PX of the display area DA, and the active pattern 131d is disposed in the driving circuit portions 400a and 400b of the peripheral area PA.

The active pattern 131a includes a channel region 134a that forms the channel of the pixel transistor Ta, a source region 133a, and a drain region 135a. The source region 133a and the drain region 135a are conductive regions connected to the channel region 134a. The active pattern 131d includes a channel region 134d that forms the channel of the driving transistor Td, a source region 133d, and a drain region 135d. The source region 133d and the drain region 135d are conductive regions connected to the channel region 134d. The source regions 133a and 133d and the drain regions 135a and 135d may be interchanged with names to distinguish the conductive regions located on both sides of the channel regions 134a and 134d. In an exemplary embodiment, the carrier concentrations of the source regions 133a and 133d and the drain regions 135a and 135d are higher than the carrier concentrations of the channel regions 134a and 134d.

The active patterns 131a and 131d may include an oxide semiconductor material such as indium gallium zinc oxide (IGZO) or zinc tin oxide (ZTO), but is not limited thereto. A patterned gate insulation layer 144a is disposed on the active pattern 131a and a patterned gate insulation layer 144d is disposed on the active pattern 131d. The gate insulation layer 144a is disposed on the channel region 134a of the active pattern 131a while overlapping the channel region 134a, and the gate insulation layer 144d is disposed on the channel region 134d of the active pattern 131d while overlapping the channel region 134d. The gate insulation layer 144a may overlap boundaries between the source region 133a or drain region 135a and the channel region 134a of the active pattern 131a. The gate insulation layer 144d may overlap boundaries between the source region 133d or drain region 135d and the channel region 134d of the active pattern 131d.

Referring to FIG. 2, the boundary between the source region 133a or the drain region 135a and the channel 134a of the active pattern 131a may extend substantially in parallel with an edge of the gate insulation layer 144a. Referring to FIG. 4, the boundary between the source region 133d or the drain region 135d and the channel region 134d of the active pattern 131d may extend substantially in parallel with an edge of the gate insulation layer 144d.

Gate electrode 154a may be disposed on the gate insulation layer 144a and gate electrode 154d may be disposed on the gate insulation layer 144d. The gate electrode 154a may overlap the gate insulation layer 144a and the channel region 134a of the active pattern 131a and cross the active pattern 131a. The gate electrode 154d may overlap the gate insulation layer 144*d* and the channel region 134*d* of the active pattern 131*d* and overlap the active pattern 131*d*.

Referring to FIG. 2 to FIG. 4, an edge of the gate electrode 154*a* may be located inside the edge of the gate insulation layer 144*a*, and an edge of the gate electrode 154*d* may be located inside the edge of the gate insulation layer 144*d*. For example, the edge of the gate insulation layer 144*a* may extend past the edge of the gate electrode 154*a*. For example, the edge of the gate insulation layer 144*d* may extend past the edge of the gate electrode 154*d*. In a plan view, the edge of the gate electrode 154*a* may be substantially in parallel with the edge of the gate insulation layer 144*a*, and the edge of the gate electrode 154*d* may be substantially in parallel with the edge of the gate insulation layer 144*d*.

An insulation layer 160 is disposed on the gate electrodes 154*a* and 154*d*. The insulation layer 160 may include an opening 63 disposed on the source region 133*a* of the active pattern 131*a*, an opening 65 disposed on the drain region 135*a* of the active pattern 131*a*, an opening 63*d* disposed on the source region 133*d* of the active pattern 131*d*, and an opening 65*d* disposed on the drain region 135*d* of the active pattern 131*d*.

At least one of the buffer layer 120, the gate insulation layers 144*a* and 144*d*, and the insulation layer 160 may include an inorganic insulation material such as silicon nitride (SiNx), a silicon oxide (SiOx), silicon oxynitride (SiON), and/or an organic insulation material.

Source electrodes 173*a* and 173*d* and drain electrodes 175*a* and 175*d* may be disposed on the insulation layer 160. The source electrode 173*a* may be electrically connected with the source region 133*a* through the opening 63, the drain electrode 175*a* may be electrically connected with the drain region 135*a* through the opening 65, the source electrode 173*d* may be electrically connected with the source region 133*d* through the opening 63*d*, and the drain electrode 175*d* may be electrically connected with the drain region 135*d* through the opening 65*d*.

At least one of the gate electrodes 154*a* and 154*d*, the source electrodes 173*a* and 173*d*, and the drain electrodes 175*a* and 175*d* may include copper (Cu), aluminum (Al), magnesium (Mg), silver (Ag), gold (Au), platinum (Pt), palladium (Pd), nickel (Ni), neodymium (Nd), iridium (Jr), molybdenum (Mo), tungsten (W), titanium (Ti), chromium (Cr), tantalum (Ta), and an alloy thereof, and may include a single layer or a multiple layer.

The pixel transistor Ta includes the channel region 134*a*, the source region 133*a*, the drain region 135*a*, and the gate electrode 154*a*. The source region 133*a* and the drain region 135*a* may be respectively included in a source terminal and a drain terminal of the pixel transistor Ta, and the gate electrode 154*a* may be included in a gate terminal of the pixel transistor Ta. The driving transistor Td includes the channel region 134*d*, the source region 133*d*, the drain region 135*d*, and the gate electrode 154*d*. The source region 133*d* and the drain region 135*d* may be respectively included in a source terminal and a drain terminal of the driving transistor Td, and the gate electrode 154*d* may be included in a gate terminal of the driving transistor Td.

Referring to FIG. 2 to FIG. 5, the gate insulation layer 144*a* includes an outer portion 14*a* that does not overlap the gate electrode 154*a* in a third direction DR3, and the gate insulation layer 144*d* includes an outer portion 14*d* that does not overlap the gate electrode 154*d* in the third direction DR3. The third direction D3 may be perpendicular to the top surface of the substrate 110. In the present exemplary embodiment, a width Wa of the outer portion 14*a* and a width Wd of the outer portion 14*d* are both greater than zero. In an exemplary embodiment, the width Wd of the outer portion 14*d* is larger than the width Wa of the outer portion 14*a*. In an exemplary embodiment, the widths Wa and Wd both imply a width on a plane that is parallel with the top surface of the substrate 110 or a width in a plan view, and this may apply to other areas of the following description unless otherwise stated in the same. According to an exemplary embodiment of the invention, the width Wa of the outer portion 14*a* is substantially or precisely zero.

Accordingly, a distance between the drain region 135*a* and the gate electrode 154*a* of the pixel transistor Ta is greater than a distance between the drain region 135*d* and the gate electrode 154*d* of the driving transistor Td.

In an exemplary embodiment, the outer portion 14*a* has a shape that extends with a constant width Wa around the gate electrode 154*a*, and the outer portion 14*d* has a shape that extends with the constant width Wd around the gate electrode 154*d*.

In an exemplary embodiment, the width Wd of the outer portion 14*d* is about 1 micrometer to about 2 micrometers. In an exemplary embodiment, about 1 micrometer is +/−1%, 2%, or 5% to generate ranges such as 0.99-1.01 micrometers, 0.98-1.02 micrometers, and 0.95-1.05 micrometers, respectively. In an exemplary embodiment, about 2 micrometers is +/−1%, 2%, or 5% to generate ranges such as 1.98-1.02 micrometers, 1.96-2.04 micrometers, and 1.9-2.1 micrometers, respectively. In an exemplary embodiment, the width Wd of the outer portion 14*d* is about 1.7 micrometers. In an exemplary embodiment, about 1.7 micrometers may include ranges such as 1.6-1.8 micrometers and 1.65-1.75 micrometers. The width Wd of the outer portion 14*d* may vary depending on the characteristics of the driving transistor Td, the film condition of the active pattern 131*d*, the buffer layer 120, the gate insulation layer 144*d*, and the insulation layer 160.

Figure 6:
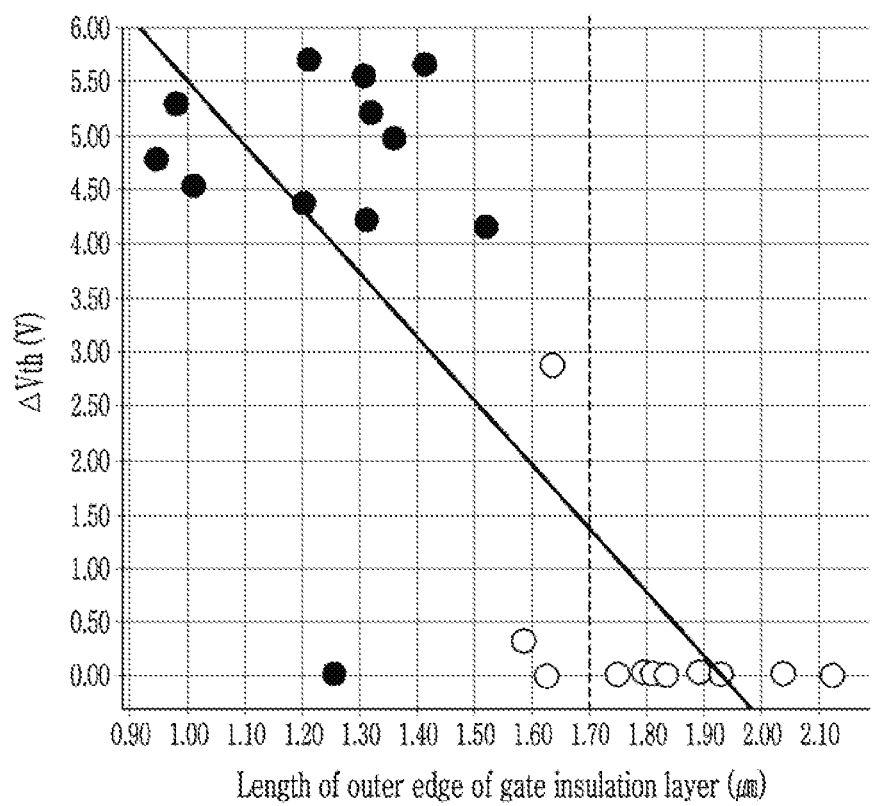
FIG. 6 is a graph that shows a change amount of a threshold voltage according to a length of an outer portion of a gate insulation layer of a driving transistor included in a driving circuit portion of the display device according to an exemplary embodiment of the present invention.
Figure 7:
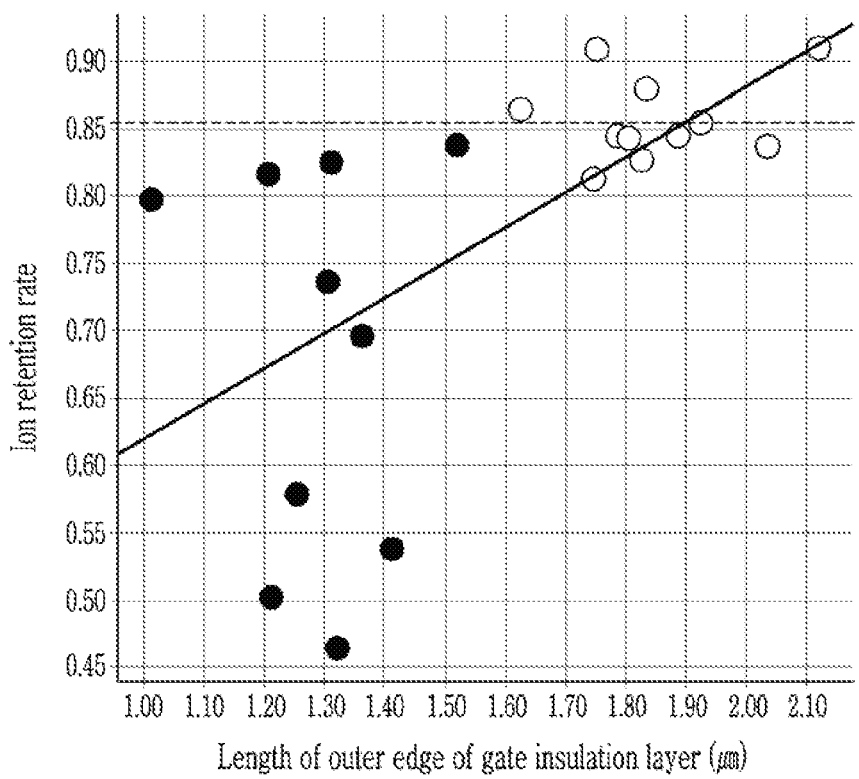
FIG. 7 is a graph that shows an on-current retention rate according to a length of the outer portion of the gate insulation layer of the driving transistor included in the driving circuit portion of the display device according to an exemplary embodiment of the present invention.
Figure 8:
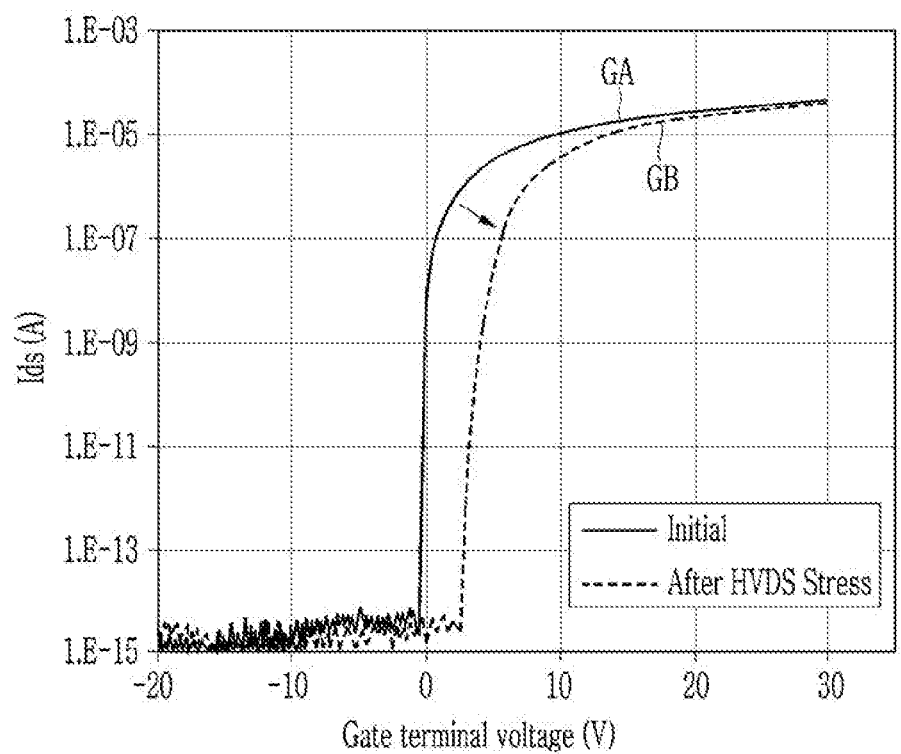
FIG. 8 is a graph that illustrates variation of a source-drain current graph with respect to a gate terminal voltage of a driving transistor included in a driving circuit portion of a display device according to a comparative example, and variation of a source-drain current graph of the driving transistor included in the driving circuit portion according to an exemplary embodiment of the present invention, FIG. 9, FIG. 10, FIG. 11 and FIG. 12 sequentially illustrate a manufacturing process of a pixel transistor included in a pixel circuit portion according to a manufacturing method of a display device according to an exemplary embodiment of the present invention, FIG. 13, FIG. 14, FIG. 15 and FIG. 16 sequentially show a manufacturing method of a driving transistor included in a driving circuit portion according to a manufacturing method of a display device according to an exemplary embodiment of the present invention.

Referring to FIG. 6 to FIG. 8, the degradation prevention effect of the driving transistor Td of the display device according to an exemplary embodiment of the present invention will be described together with the drawings described previously.

FIG. 6 is a graph that shows a change amount V of a threshold voltage ΔVth according to a length (which is the same as the above-described width Wd) of the outer portion 14*d* of the gate insulation layer 144*d* of the driving transistor Td after a high voltage, for example, a high voltage over 35 V, is applied between the source region 133*d* and the drain region 135*d* of the driving transistor Td included in the driving circuit portions 400*a* and 400*b* of the display device according to an exemplary embodiment of the present invention. Referring to FIG. 6, it can be seen that the change amount of the threshold voltage ΔVth of the driving transistor Td is almost zero since the length of the outer portion 14*d* is a predetermined value. Such a predetermined value of the length of the outer portion 14*d* according to the present exemplary embodiment may be approximately 1.7 micrometers. In an exemplary embodiment, approximately 1.7 micrometers includes ranges such as 1.6-1.8 micrometers and 1.65-1.75 micrometers.

FIG. 7 is a graph that shows an on-current retention rate according to a length (which is the same as the above-described width Wd) of the outer portion 14*d* of the gate insulation layer 144*d* of the driving transistor Td after a high voltage, for example, a high voltage over 35 V, is applied between the source region 133*d* and the drain region 135*d* of the driving transistor Td included in the driving circuit portions 400*a* and 400*b* of the display device according to an exemplary embodiment of the present invention. Referring to FIG. 7, it can be seen that the retention rate of the on-current Ion is maintained at a certain level (e.g., approximately 0.8 or more) since the length of the outer portion 14d is a predetermined value. Such a predetermined value of the length of the outer portion 14d according to the present exemplary embodiment may be approximately 1.5 micrometers. In an exemplary embodiment, approximately 1.5 micrometers includes ranges such as 1.4-1.6 micrometers and 1.45-1.55 micrometers.

FIG. 8 is a graph that illustrates variation of a source-drain current Ids graph with respect to a gate terminal voltage V of a driving transistor included in a driving circuit portion of a display device according to a comparative example, and variation of a source-drain current Ids graph with respect to a gate terminal voltage V of a driving transistor Td included in driving circuit portions 400a and 400b according to an exemplary embodiment of the present invention. A driving transistor included in a driving circuit portion of a display device according to a comparative example is mostly the same as the driving transistor Td according to the present exemplary embodiment, but a width or length of an outer portion of a gate insulation layer may be 0 or more or about 1 micrometer or less. In an exemplary embodiment, about 1 micrometer includes ranges such as 0.99-1.01 micrometers and 0.98-1.02 micrometers.

Compared to a characteristic graph GA before applying a high voltage, for example, a high voltage over 35 V, between a source terminal and a drain terminal of a driving transistor according to the comparative example, a characteristic graph GB after applying a high voltage between the source terminal and the drain terminal is considerably shifted to the right, indicating that a threshold voltage change of the driving transistor is large and an on-current Ion is also lowered.

However, according to an exemplary embodiment of the present invention, the characteristic graph GA before and after applying a high voltage between the source terminal and the drain terminal of the driving transistor Td is substantially equivalent so that the amount of change in the threshold voltage of the driving transistor Td is relatively small, and the on-current is also maintained. This also matches an experiment result of FIG. 6 and FIG. 7.

When driving the driving circuit portions 400a and 400b, with at least some timing, a high voltage (e.g., 35 V or more) may be applied between the source region 133d and the drain region 135d of the driving transistor Td. In this case, a strong electric field is formed between the drain region 135d of the driving transistor Td and the gate electrode 154d as described above, and a carrier trap may occur to cause on-current deterioration and threshold voltage shifts. As a result, the characteristic of the driving transistor Td may be degraded, thereby causing a problem that driving of the driving circuit portions 400a and 400b is not stable.

However, according to an exemplary embodiment of the present invention, a distance between the drain region 135d of the driving transistor Td and the gate electrode 154d is larger than a distance between the drain region 135a of the pixel transistor Ta and the gate electrode 154a, thereby securing a sufficient distance. Thus, even through a high voltage is applied between the source region 133d and the drain region 135d, a strong electric field can be prevented from being formed between the drain region 135d and the gate electrode 154d. Therefore, the on-current deterioration of the driving transistor Td and the threshold voltage shift can be prevented and reliability of the driving transistor Td can be improved. Accordingly, the driving circuit portions 400a and 400b can be stably driven due to tolerance to a high voltage. In addition, a usable voltage range of the driving transistor Td1 can be expanded.

On the other hand, the width Wa of the outer portion 14a of the pixel transistor Ta is set to be smaller than the width Wd of the outer portion 14d of the driving transistor Td for distinguishing the pixel transistor Ta from the driving transistor Td, such that when a display portion is a current-driven light emitting diode, the display characteristics of the display area DA can be improved by maintaining high on-current and mobility.

Next, referring to FIG. 9 and FIG. 10, a method for manufacturing a pixel transistor Ta included in a pixel circuit portion according to a manufacturing method of a display device according to an exemplary embodiment of the present invention will be described, together with the above-described drawings.

FIG. 9, FIG. 10, FIG. 11, and FIG. 12 sequentially illustrate a manufacturing process of a pixel transistor Ta included in a pixel circuit portion according to a manufacturing method of a display device according to an exemplary embodiment of the present invention.

Figure 9:
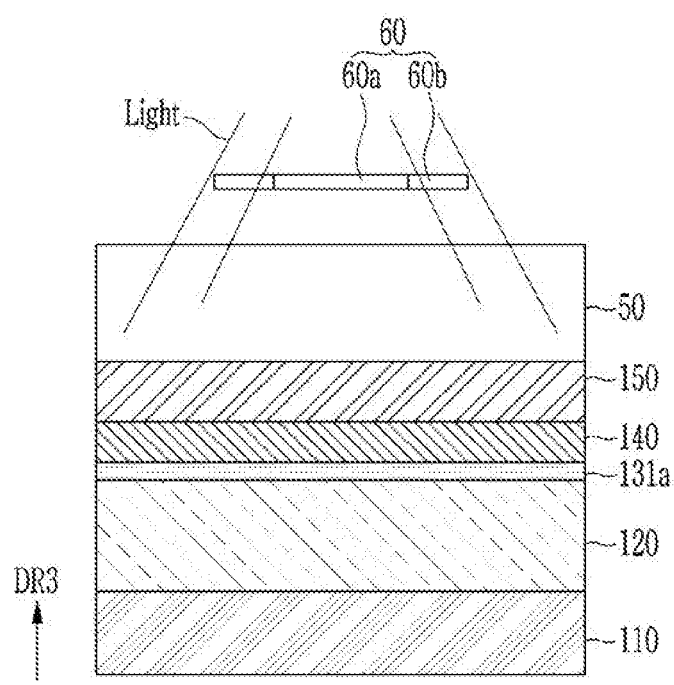

First, referring to FIG. 9, a buffer layer 120, which is an insulation layer (e.g., first insulation layer), is stacked or formed on a substrate 110, an active layer is formed on the buffer layer 120 and then patterned to generate an active pattern 131a. An insulation layer 140 (e.g., a second insulation layer) is formed on the active pattern 131a, and a conductive material is stacked or formed on the insulation layer 140 to generate a conductive layer 150. A photoresist layer 50 is stacked or formed on the conductive layer 150, and then light such as ultraviolet (UV) rays is applied to the photoresist layer 50 through a photomask 60. For example, the photoresist layer 50 is irradiated with light.

The photoresist layer 50 may include a negative photoresist material or a positive photoresist material, and in the present exemplary embodiment, the photoresist layer 50 exemplarily includes a positive photoresist material where portions irradiated by light can be removed. For example, the portions irradiated with light can be subsequently removed using a solvent referred to as a developer or a developer solution. The portions that are irradiated with light may be referred to as exposed portions and the portions that are not irradiated with light may be referred to as non-exposed portions. In an exemplary embodiment, the non-exposed portions are not removed when the developer solution is applied.

The photomask 60 includes light blocking portions 60a and 60b blocking at least a part of the light, and the light blocking portions 60a and 60b may include two or more light blocking portions 60a and 60b, each having a different light transmission amount or light blocking rate. In an exemplary embodiment, a light blocking rate of the light blocking portion 60a is higher than that of the light blocking portion 60b. As such, in a photomask including light blocking portions, each having a different light transmission amount or light blocking rate, like the light blocking portion 60b, a region that transmits or blocks only a part of light is called a halftone region. Portions other than the light blocking portions 60a and 60b may be light transmitting portions through which light can be transmitted.

Figure 10:
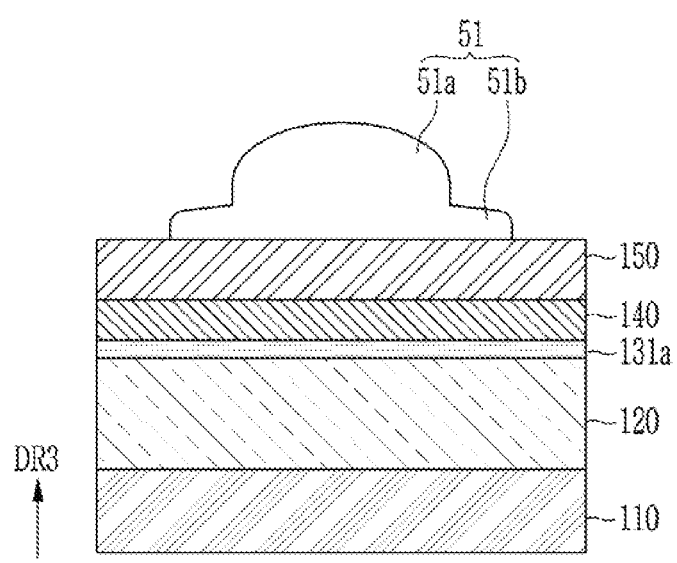

When an exposed photoresist layer 50 is exposed to a developing solution, as shown in FIG. 10, a mask pattern 51 including portions 51a and 51b, each having a different thickness in a third direction DR3, is formed. For example, an exposed photoresist layer 50 may refer to a photoresist layer including at least some portion that previously received light. A thick portion 51a of the mask pattern 51 is formed corresponding to the light blocking portion 60a of the photomask 60, and a thin portion 51b of the mask pattern 51 is formed corresponding to the light blocking portion 60b of the photomask 60. While elements 60a and 60b are referred to as light blocking portions, in exemplary embodiments, elements 60a and 60b do not block all light, but allow different amounts of light to pass therethrough.

Figure 11:
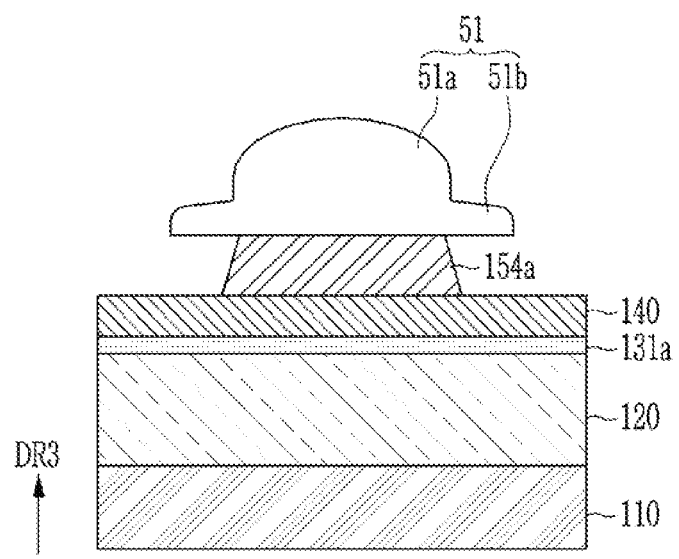

Next, the conductive layer 150 is etched by using the mask pattern 51 as a mask to form a gate electrode 154a as shown in FIG. 11. In this case, wet etching may be used to etch the conductive layer 150. In etching of the conductive pattern 150, etching time and etchant concentration may be adjusted to locate an edge of the gate electrode 154a to be inside an edge of the mask pattern 51. For example, the wet etching may at least remove portions of the conductive layer 150 below portions 51b.

Figure 12:
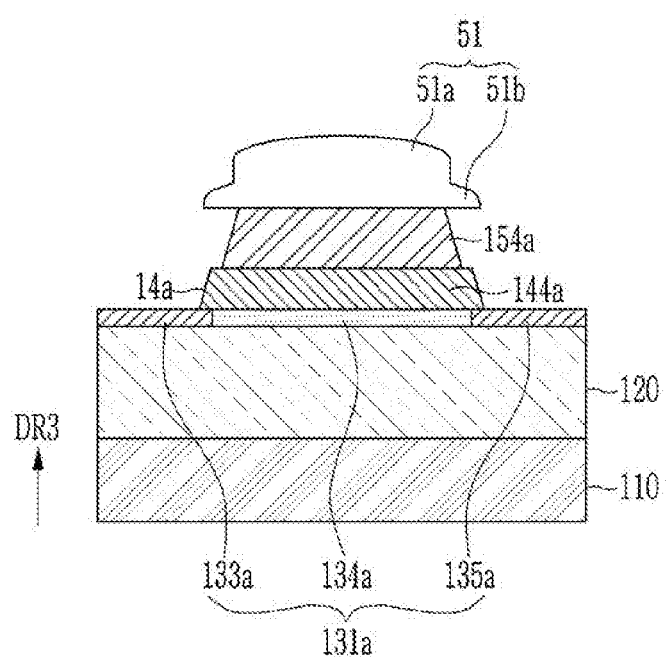

Next, the insulation layer 140 is etched by using the mask pattern 51 as a mask such that a patterned gate insulation layer 144a is formed as shown in FIG. 12. In this case, dry etching may be used to etch the insulation layer 140. In this process, the thickness of the mask pattern 51 may be reduced and a width of the thin portion 51b may be shortened, and accordingly, an edge portion of the gate insulation layer 144a is further etched such that a width of an outer edge portion 14a may be reduced as previously described.

In the patterning process of the gate insulation layer 144a, a component of an etching gas is doped to the active pattern 131a which is not covered by the gate insulation layer 144a such that a source region 133a and a drain region 135a, which have low resistance, can be formed. After the gate insulation layer 144a is patterned, the active pattern 131a which is not covered by the gate insulation layer 144a is treated so that the source region 133a and the drain region 135a may be formed. In this case, as a treatment method, a heat treatment method in a reducing atmosphere, and a plasma treatment method using a gas plasma containing a reducing material such as hydrogen ($H_2$) or helium (He) may be used.

Next, referring to the above-described FIG. 3, an inorganic insulation material such as a silicon nitride (SiNx), a silicon oxide (SiOx), and a silicon oxynitride (SiON) is stacked or formed on the substrate 110 where the gate electrode 154a and the gate insulation layer 144a are formed such that an insulation layer 160 is formed. In an exemplary embodiment, a component such as hydrogen included in a gas such as $SiH_4$ or $NH_3$ used in a stacking process of the insulation layer 160 is injected into the active pattern 131a that contacts the insulation layer 160 such that the conductive source and drain regions 133a and 135a are formed or the carrier concentration of the already-formed source region 133a and drain region 135a may be increased more. A component such as hydrogen included in the insulation layer 160 may be dispersed into the source region 133a and the drain region 135a even after the insulation layer 160 is formed so that the source region 133a and the drain region 135a may have a low resistance.

Next, referring to FIG. 13 to FIG. 16 and the above-described FIG. 4 and FIG. 5, a method for manufacturing a driving transistor Td included in a driving circuit portion according to a manufacturing method of a display device according to an exemplary embodiment of the present invention will be described.

FIG. 13, FIG. 14, FIG. 15, and FIG. 16 sequentially show a manufacturing method of a driving transistor Td included in a driving circuit portion according to a manufacturing method of a display device according to an exemplary embodiment of the present invention.

Figure 13:
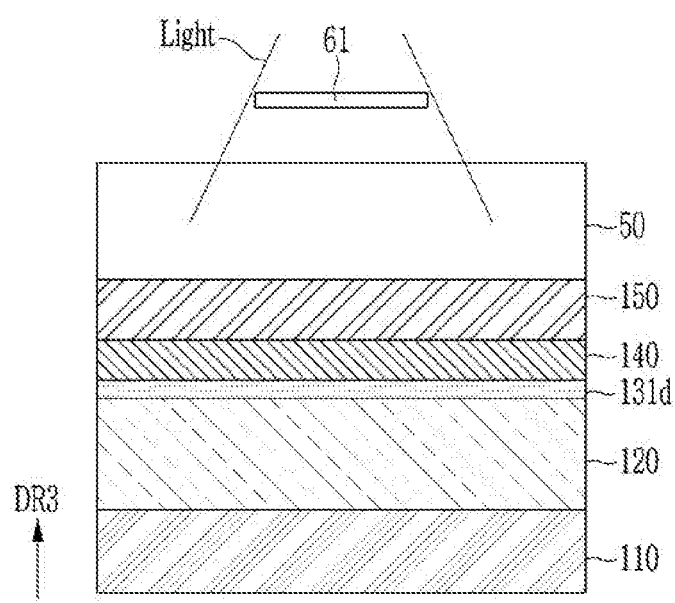

First, referring to FIG. 13, a buffer layer 120, which is an insulation layer, is stacked on a substrate 110, an active layer is formed on the buffer layer 120, and then patterned to form an active pattern 131d. An insulation layer 140 is formed on the active pattern 131d, and a conductive material is stacked on the insulation layer 140 to form a conductive layer 150. After stacking or forming a photoresist layer 50 on the conductive layer 150, light such as ultraviolet rays are applied to the photoresist layer 50 through a photomask. For example, the photoresist layer 50 is irradiated with light.

The photomask includes a light blocking portion 61 that blocks light. In an exemplary embodiment, the light blocking rate of the light blocking portion 61 is constant throughout, which differs from the different light blocking rates of the light blocking portions 60a and 60b. For example, each section of the light blocking portion 61 may block a same amount of light.

Figure 14:
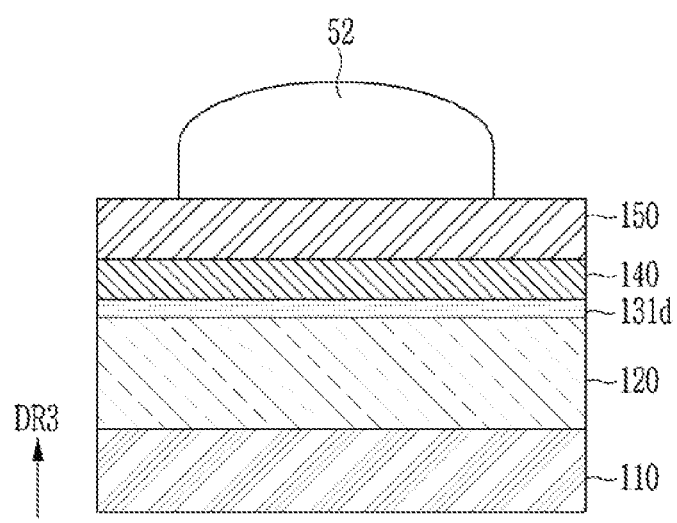

When the exposed photoresist layer 50 is exposed to a developer, a mask pattern 52 corresponding to the light blocking portion 61 of the photomask is formed as shown in FIG. 14. In an exemplary embodiment, a thickness of the mask pattern 52 is thicker than a thin portion 51b of the mask pattern 51 described above and may have a thickness similar to or the same as a thickness of the thick portion 51a, but is not limited thereto.

Figure 15:
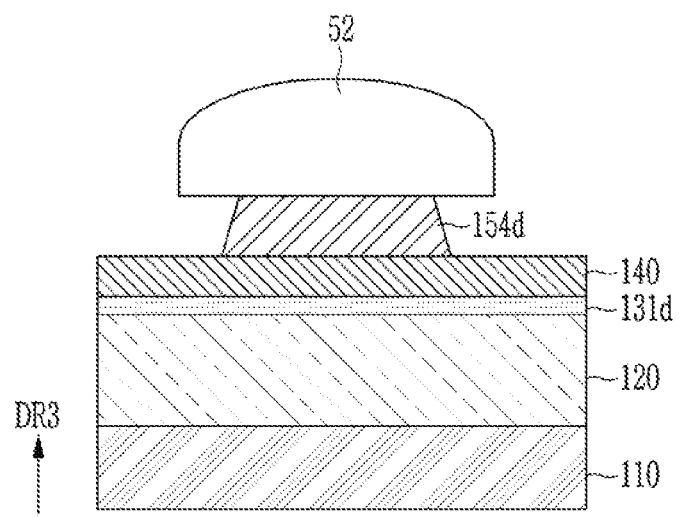

Next, the conductive layer 150 is etched by using the mask pattern 52 as a mask so that a gate electrode 154d shown in FIG. 15 is formed. In this case, wet etching may be used. An edge of the gate electrode 154d may be etched by adjusting the etching time and/or the concentration of the etching solution to be located inside the edge of the mask pattern 52.

Figure 16:
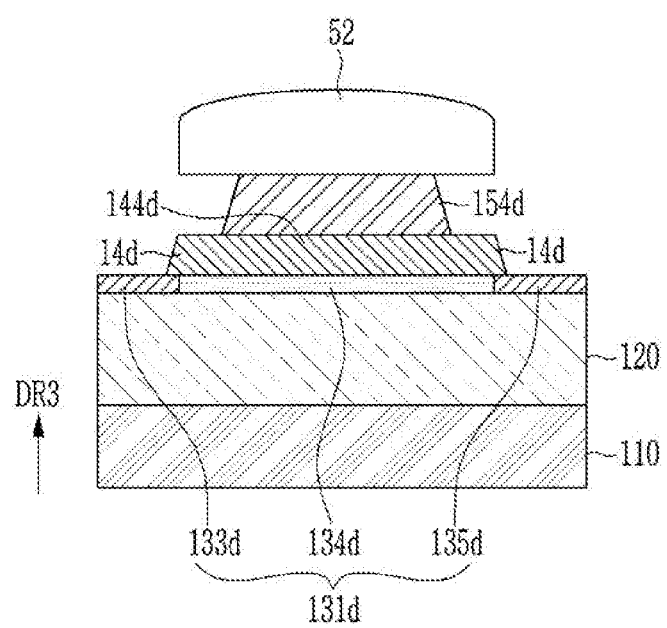

Next, the insulating layer 140 is etched using the mask pattern 52 as a mask to form a gate insulating layer 144d as shown in FIG. 16. In this case, dry etching may be used. An edge of the gate insulation layer 144d may be formed corresponding to the edge of the mask pattern 52. Accordingly, an outer portion 14d of the gate insulation layer 144d has a wider width than an outer portion 14a of the gate insulation layer 144a of the pixel transistor Ta. For example, portions of the insulating layer 140 up to edges of the mask pattern 52 may be removed.

As previously described, an etch gas component may be doped with an active pattern 131d not covered with the gate insulation layer 144d so that a low-resistive source region 133a and a drain region 135a may be formed during the process of patterning the gate insulating layer 144d, and the source region 133a and the drain region 135a may be formed by processing the active pattern 131d exposed by a plasma treatment method after the patterning of the gate insulation layer 144d. In addition, referring to the above-described FIG. 5, a component such as hydrogen may diffuse into the source region 133a and the drain region 135a to have low resistance during or after the process of forming the insulation layer 160 formed on the gate electrode 154d and the gate insulating layer 144d.

Next, referring to FIG. 17, a display device according to an exemplary embodiment of the present invention will be described. The same reference numerals are used for the same constituent elements as those of the exemplary embodiment described above, and accordingly, the same description is omitted.

Figure 17:
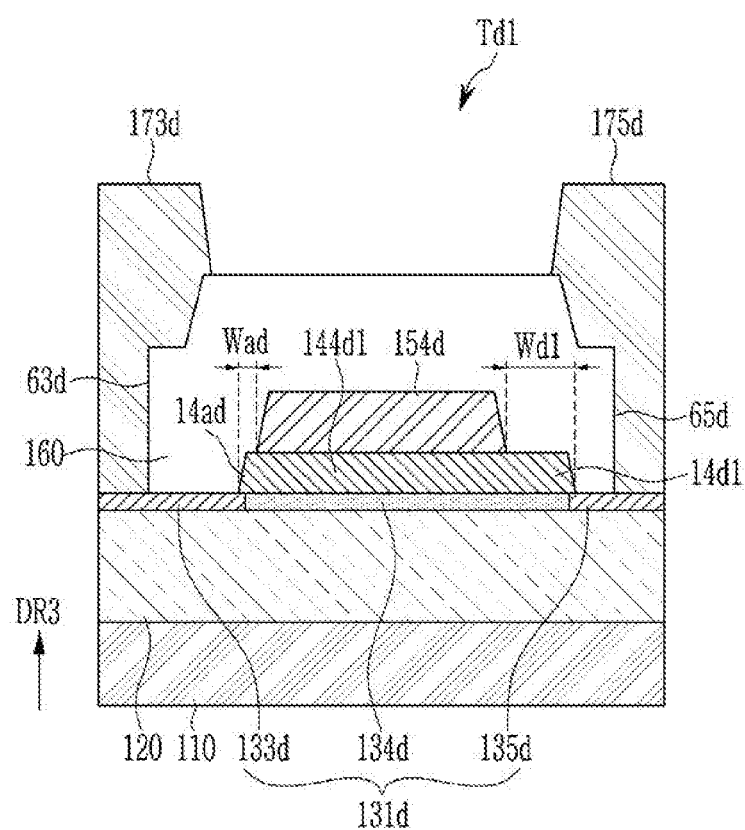
FIG. 17 is a cross-sectional view of a driving transistor included in the driving circuit portion of the display device according to an exemplary embodiment of the present invention, FIG. 18, FIG. 19, FIG. 20 and FIG. 21 sequentially show a manufacturing process of a driving transistor included in a driving circuit portion according to a manufacturing method of a display device according to an exemplary embodiment of the present invention.

FIG. 17 is a cross-sectional view of a driving transistor Td1 included in a driving circuit portion of a display device according to an exemplary embodiment of the present invention.

A display device according to the present exemplary embodiment is almost the same as the display device of the above-described exemplary embodiment, except for a structure of the driving transistor Td1 included in the driving circuit portion. That is, the driving transistor Td1 has almost the same structure and features as the above-described driving transistor Td, but the driving transistor Td1 has a gate insulation layer 144d1 instead of the above-described gate insulation layer 144d. The display device according to the present exemplary embodiment may include the same pixel transistor as the above-described pixel transistor Ta.

Referring to FIG. 17, the gate insulation layer 144d1 included in the driving transistor Td1 according to the present exemplary embodiment includes outer portions 14ad and 14d1 that do not overlap a gate electrode 154d in a third direction DR3, and the outer portions 14ad and 14d1 may have portions having different widths. In an exemplary embodiment, a width Wad of the outer portion 14ad in a source region 133d is smaller than a width Wd1 of the outer portion 14d1 in a drain region 135d. In an exemplary embodiment, the width Wd1 is at least twice the width Wad. In another exemplary embodiment, the width Wd1 is at least three times the width Wad.

In the present exemplary embodiment, the width Wad of the outer portion 14ad and the width Wd1 of the outer portion 14d1 are greater than zero. The width Wd1 of the outer portion 141d1 may be similar to or the same as the width Wd of the outer portion 14d of the gate insulation layer 144d of the driving transistor Td according to the above-described exemplary embodiment, but is not limited thereto.

When a high voltage is applied between the source region 133d and drain region 135d, an area adjacent to the outer portion 14d1 among the source region 133d and the drain region 135d may be an area where a high potential is applied. According to the present exemplary embodiment, even when a high potential (e.g., a high voltage such as one greater than 35 volts) is applied to the drain region 135d as described above, a strong electric field can be prevented from being formed between the drain region 135d and the gate electrode 154d, and thus it is possible to prevent the on-current drop of the driving transistor Td1 and shift of a threshold voltage. Thus, a reliability of the driving transistor Td1 may be increased, and resistance to high voltages can be increased to stably drive the driving circuits 400a and 400b. In addition, a usable voltage range of the driving transistor Td1 can be expanded.

Further, according to the present exemplary embodiment, the width Wad of the outer portion 14ad at a side adjacent to the source region 133d is relatively small so that on-current and mobility can be maintained.

Next, referring to FIG. 18 and FIG. 21, together with FIG. 17, a method for manufacturing a driving transistor Td1 included in a driving circuit portion according to a manufacturing method of a display device according to an exemplary embodiment of the present invention will be described.

FIG. 18, FIG. 19, FIG. 20, and FIG. 21 sequentially show a manufacturing process of a driving transistor Td1 included in a driving circuit portion according to a manufacturing method of a display device according to an exemplary embodiment of the present invention.

Figure 18:
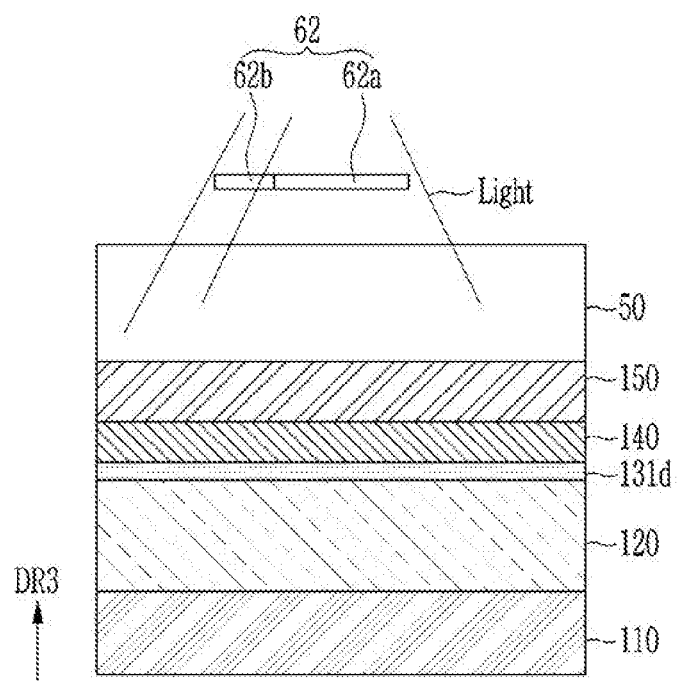

Referring to FIG. 18, a buffer layer 120, which is an insulation layer, an active pattern 131d, an insulation layer 140, a conductive layer 150, and a photoresist layer 50 are sequentially formed on a substrate 110, and then light such as UV rays are applied to the photoresist layer 50 through a photomask 62. For example, the photoresist layer 50 may be irradiated with light. The photomask 62 may include light blocking portions 62a and 62b that block at least a part of light, and the light blocking portions may include two or more light blocking portions 62a and 62b, each having a different light transmittance or a light blocking rate. In an exemplary embodiment, the light blocking rate of the light blocking portion 62a is higher than that of the light blocking portion 62b. Portions excluding the light blocking portions 62a and 62b may be light transmitting portions through which light can pass.

Figure 19:
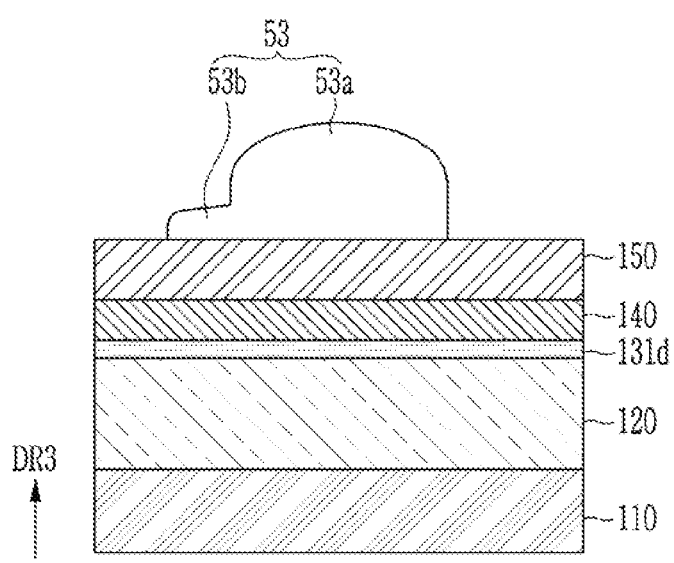

When the exposed photoresist layer 50 is exposed to a developing solution, a mask pattern 53 that includes portions 53a and 53b, each having a different thickness in a third direction DR3 is formed as shown in FIG. 19. A thick portion 53a of the mask pattern 53 is formed corresponding to the light blocking portion 62a of the photomask 62, and a thin portion 53b of the mask pattern 53 is formed corresponding to the light blocking portion 62b of the photomask 62. In an exemplary embodiment, the thin portion 52b is disposed only on one side of the thick portion 53a.

Figure 20:
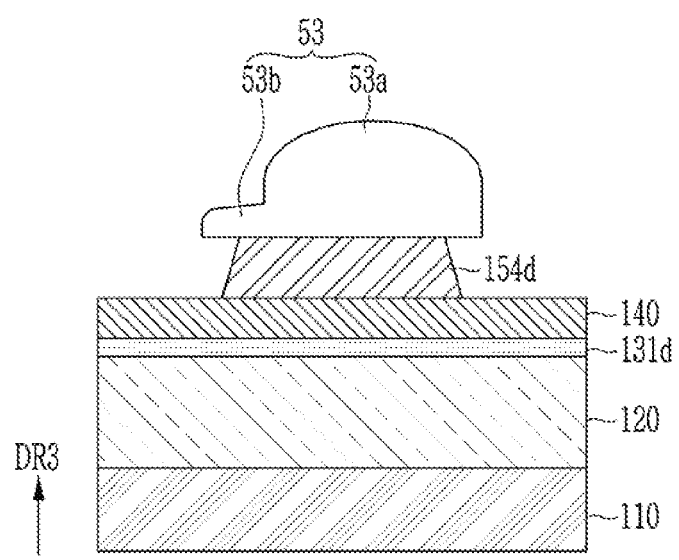

Next, the conductive layer 150 is etched by using the mask pattern 53 as a mask to form a gate electrode 154d as shown in FIG. 20. In this case, dry etching may be used. An edge of the gate electrode 154d may be etched to be located inside an edge of the mask pattern 53. For example, a part of the conductive layer 150 below portion 53b may be removed and part of the conductive layer 150 below a part of the portion 53a may be removed.

Figure 21:
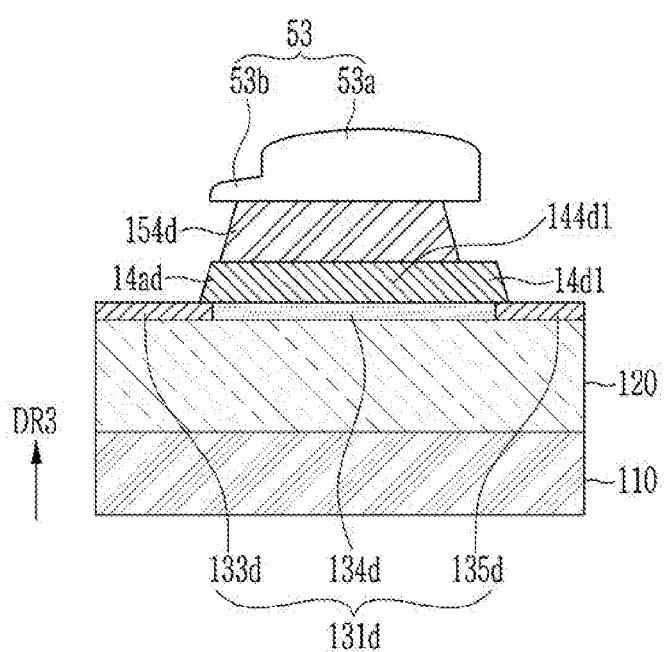

Next, the insulation layer 140 is etched by using the mask pattern 53 as a mask to form a patterned gate insulation layer 144d1 as shown in FIG. 21. In this case, dry etching may be used. In this process, a thickness of the mask pattern 53 may be reduced and a width of the thin portion 53b may be shortened, and accordingly, an edge portion of the gate insulation layer 144d1 disposed below the thin portion 53b of the mask pattern 53 may be more etched such that a width of the outer portion 14ad may be reduced as previously described. Meanwhile, the edge of the gate insulation layer 144d1 positioned below the thick portion 53a of the mask pattern 53 may be relatively less etched to form an outer portion 14d1 having a larger width than that of the outer portion 14ad.

Next, referring to FIG. 22 and FIG. 23, a display device according to an exemplary embodiment of the present invention will be described.

Figure 22:
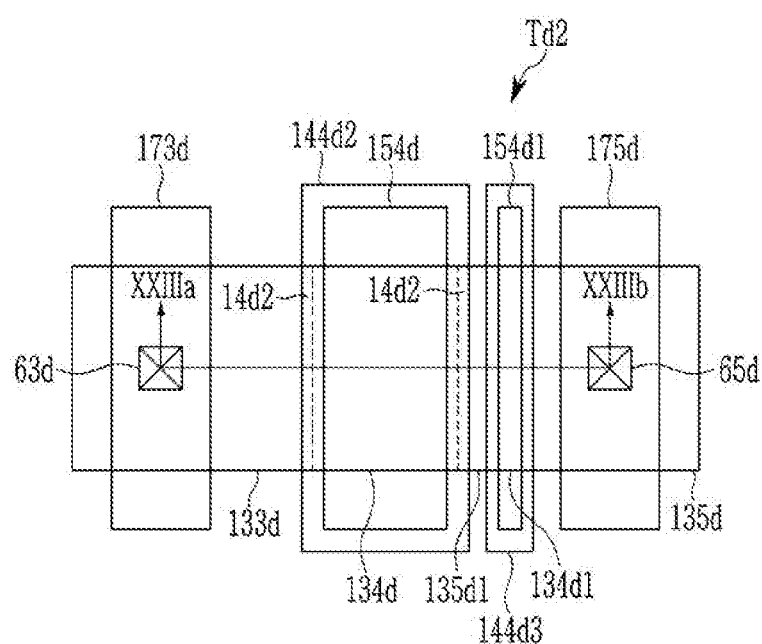
FIG. 22 is a top plan view of a driving transistor included in a driving circuit portion of a display device according to an exemplary embodiment of the present invention.
Figure 23:
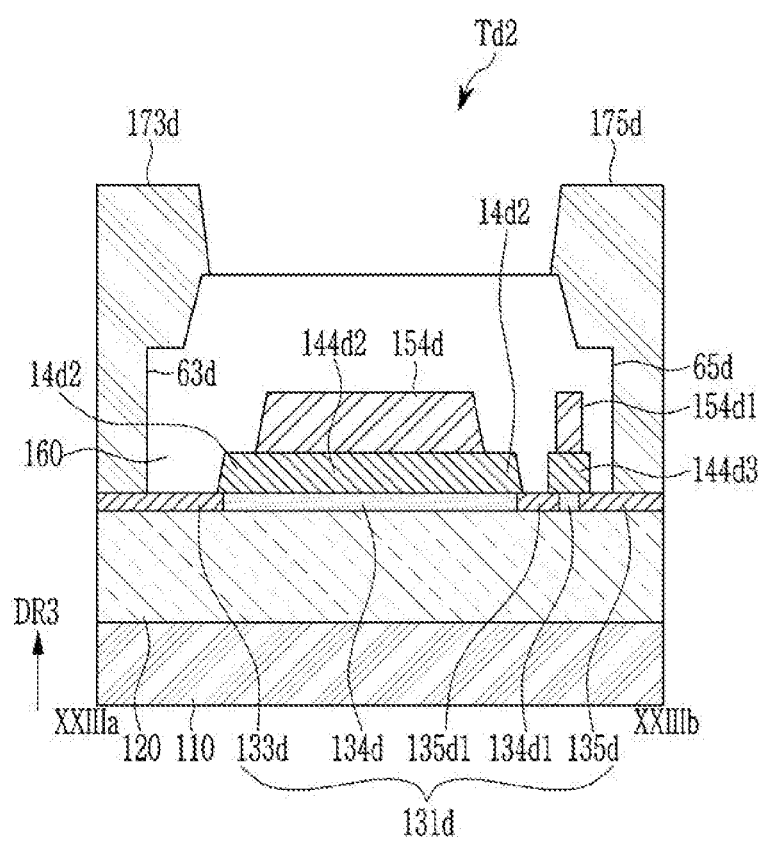
FIG. 23 is a cross-sectional view of the display device of FIG. 22, taken along line XXIIIa-XXIIIb, FIG. 24, FIG. 25, FIG. 26 and FIG. 27 sequentially show a manufacturing process of a driving transistor included in a driving circuit portion according to a manufacturing method of a display device according to an exemplary embodiment of the present invention.

FIG. 22 is a top plan view of a driving transistor Td2 included in a driving circuit portion of a display device according to an exemplary embodiment of the present invention, and FIG. 23 is a cross-sectional view of the display device of FIG. 22, taken along line XXIIIa-XXIIIb.

A display device according to the present exemplary embodiment is almost the same as the display device according to the above-described exemplary embodiment, except for a structure of a driving transistor Td included in a driving circuit portion. That is, the driving transistor Td2 has almost the same structure and features as those of the above-described driving transistor Td, but the driving transistor Td2 includes a gate insulation layer 144d2 instead of the above-described gate insulation layer 144d, and may further include a dummy electrode 154d1 and a dummy insulation layer 144d3. In addition, an active pattern 131d may further include a dummy drain region 135d1 and a dummy channel region 134d1 in addition to a channel region 134d, a source region 133d, and a drain region 135d.

The gate insulation layer 144d2 may be the same as or similar to the gate insulation layer 144a of the driving transistor Td, or may be the same as or similar to the gate insulation layer 144a of the pixel transistor Ta according to the above-described exemplary embodiment. That is, a width of an outer portion 14d2 where the gate insulation layer 144d2 does not overlap the gate electrode 154d in a third direction DR3 may be the same as or similar to the width of the outer portion 14d of the gate insulation layer 144d of the driving transistor Td, or may be the same as or similar to the width of the outer portion 14a of the gate insulation layer 144a of the pixel transistor Ta according to the above-described exemplary embodiment. In particular, in the present exemplary embodiment, the width of the outer portion 14d2 may be smaller than the width of the outer portion 14d of the gate insulation layer 144d of the driving transistor Td described above to prevent the on-current and mobility deterioration of the driving transistor Td2.

In an exemplary embodiment, the dummy drain region 135d1 and the dummy channel region 134d1 are disposed adjacent to each other, and are disposed between the channel region 134d and the drain region 135d. In an exemplary embodiment, the dummy drain region 135d1 has a higher carrier concentration than the channel region 134d and the dummy channel region 134d1. In an exemplary embodiment, a width of the dummy channel region 134d1 in a channel length direction (i.e., a horizontal direction in FIG. 22) is smaller than a width of the channel region 134d in the same direction.

The dummy electrode 154d1 is spaced apart from the gate electrode 154d, and may overlap the dummy insulation layer 144d3 and the dummy channel region 134d1 in a plan view. The dummy insulation layer 144d3 is spaced apart from the gate insulation layer 144d2. An edge of the dummy electrode 154d1 may be disposed inside an edge of the dummy insulation layer 144d3, and an edge of the dummy electrode 154d1 may be substantially in parallel with an edge of the dummy channel region 134d1 in a plan view.

In an exemplary embodiment, a width of the dummy electrode 154d1 in a channel length direction (i.e., a horizontal direction in FIG. 22) of the driving transistor Td2 is smaller than a width of the gate electrode 154d in the same direction, and a width of the dummy insulation layer 144d3 in the channel length direction (i.e., the horizontal direction in FIG. 22) of the driving transistor Td2 is smaller than a width of the gate insulation layer 144d2 in the same direction.

Edges of the dummy electrode 154d1 and the gate electrode 154d, facing each other may be substantially extended in parallel with each other, and edges of the dummy insulation layer 144d3 and the gate insulation layer 144d2, facing each other, may be substantially in parallel with the each other.

In an exemplary embodiment, the dummy electrode 154d1 is disposed on the same layer as the gate electrode 154d and is formed of the same conductive material as the gate electrode 154d. In an exemplary embodiment, the dummy insulation layer 144d3 is disposed on the same layer as the gate insulation layer 144d2 and is formed of the same insulating material as the gate insulation layer 144d2.

A gate signal that is the same gate signal applied to the gate electrode 154d may also be applied to the dummy electrode 154d1. In an exemplary embodiment, the dummy electrode 154d1 is insulated from the gate electrode 154d and is floated.

According to the present exemplary embodiment, since the dummy channel region 134d1, the dummy insulation layer 144d3, and the dummy electrode 154d1 are disposed between the drain region 135d and the gate electrode 154d of the driving transistor Td2, a distance between the drain region 135d and the gate electrode 154d may be increased. Thus, even when a high voltage is applied between the source region 133d and the drain region 135d and a high potential is applied to the drain region 135d, a strong electric field can be prevented from being formed between the drain region 135d and the gate electrode 154d. Thus, it is possible to prevent deterioration of characteristics due to the decrease in the on-current of the driving transistor Td2 and the shift of the threshold voltage, and to maintain reliability and resistance to high voltages applied to the driving transistor Td2. In addition, a usable voltage range of the driving transistor Td2 can be widened.

When the same gate signal applied to the gate electrode 154d is applied to the dummy electrode 154d1, it is also possible to prevent the formation of a strong electric field between the drain region 135d and the gate electrode 154d while maintaining the on-current and mobility of the driving transistor Td2.

Next, a method for manufacturing a driving transistor Td2 included in a driving circuit portion according to a manufacturing method of a display device according to an exemplary embodiment of the present invention will be described with reference to FIG. 24 to FIG. 27, together with FIG. 22 and FIG. 23.

FIG. 24, FIG. 25, FIG. 26, and FIG. 27 sequentially show a manufacturing process of a driving transistor Td2 included in a driving circuit portion according to a manufacturing method of a display device according to an exemplary embodiment of the present invention.

Figure 24:
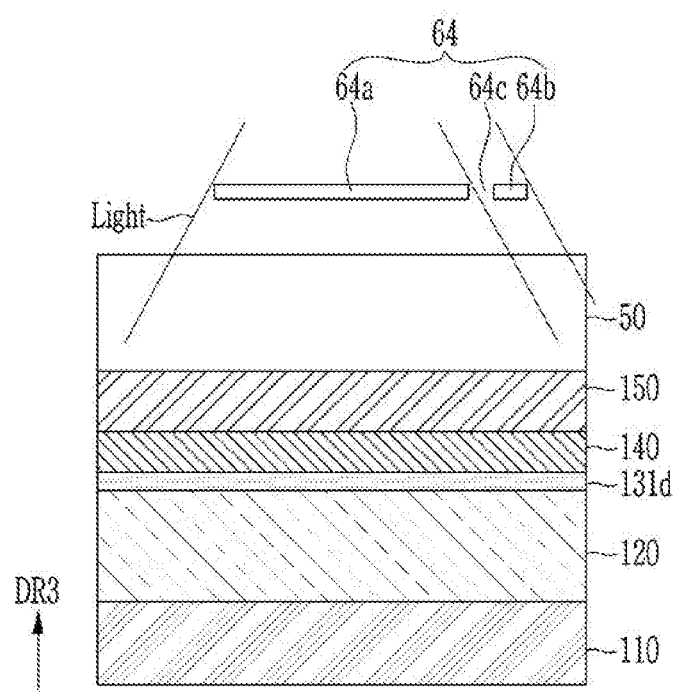

First, referring to FIG. 24, a buffer layer 120, which is an insulation layer, an active pattern 131d, an insulation layer 140, a conductive layer 150, and a photoresist layer 50 are sequentially formed on a substrate 110, and then light such as UV rays are applied to the photoresist layer 50. For example, the photoresist layer 50 is irradiated with light. For example, light may be applied to the photoresist layer 50 through a photomask 64 including two light blocking portions 64a and 64b spaced apart from each other with a light transmission portion 64c disposed therebetween. The light blocking portions 64a and 64b may have constant light blocking rates. Portions other than the light blocking portions 64a and 64b may be light transmission portions through which light is transmitted.

Figure 25:
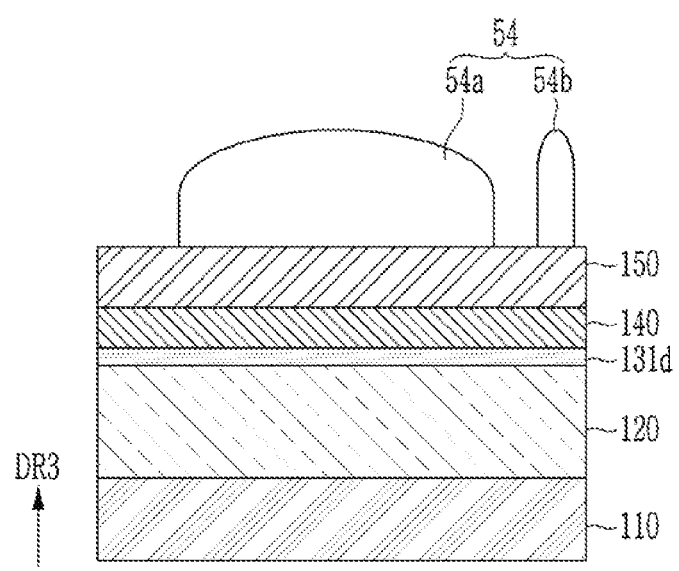

When an exposed photoresist layer 50 is exposed to a developing solution, as shown in FIG. 25, a mask pattern 54 including two portions 54a and 54b respectively corresponding to the light blocking portions 64a and 64b of the photomask 64 is formed. The two portions 54a and 54b are separated from each other such that a top surface of the conductive layer 150 may be exposed. For example, the two portions 54a and 54b may be spaced apart from one another.

Figure 26:
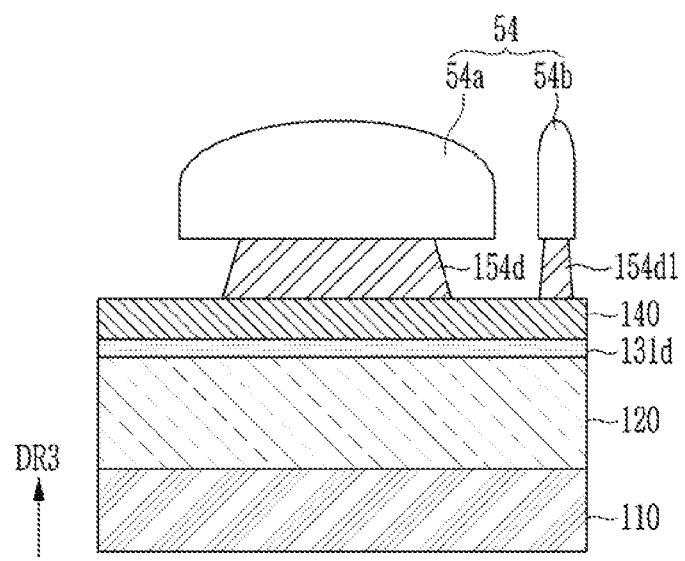

Next, the conductive layer 150 is etched by using the mask pattern 54 as a mask so that a gate electrode 154d and a dummy electrode 154d1 are formed as shown in FIG. 26. In this case, wet etching may be used. An edge of the gate electrode 154d may be located inside an edge of the portion 54a of the mask pattern 54, and an edge of the dummy electrode 154d1 may be etched to be located inside an edge of the portion 54b of the mask pattern 54. For example, a part of the conductive layer 150 below parts of portion 54a may be removed, and parts of the conductive layer 150 below parts of portion 54b may be removed.

Figure 27:
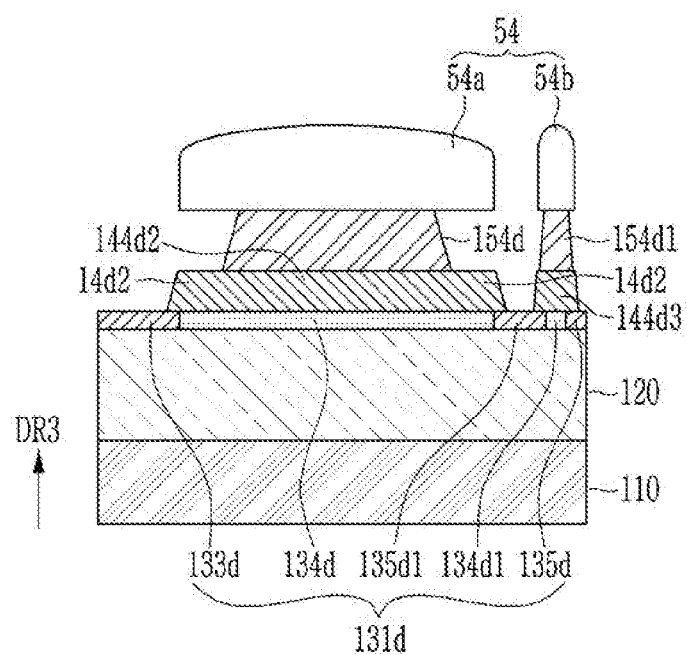

Next, the insulation layer 140 is etched using the mask pattern 54 as a mask as shown in FIG. 27 so that a gate insulation layer 144d2 and a dummy insulation layer 144d3 are formed. In this case, dry etching may be used. An edge of the gate insulation layer 144d2 may be formed to correspond to the edge of the portion 54a of the mask pattern 54, and an edge of the dummy insulation layer 144d3 may be formed to correspond to the edge of the portion 54b of the mask pattern 54. For example, the etching may remove a portion of the insulation layer 140 to generate portions (e.g., 144d2 and 144d3) of the insulation layer 140 that are spaced apart from one another.

The degree of etching of the conductive layer 150 may be adjusted like the above-described manufacturing method shown in FIG. 9 to FIG. 12 to adjust a width of an outer portion 14d2 of the gate insulation layer 144d2. The width of the outer portion 14d2 may be narrowed by using a photomask including a halftone region. In an exemplary embodiment, the width of the portion 54a of the mask pattern 54 is reduced and the etching degree of the gate electrode 154d is reduced so that the edge of the gate electrode 154d is closer to the edge of the portion 54a of the mask pattern 54. Thus, the width of the outer portion 14d2 of the gate insulation layer 144d2 may be reduced.

A structure of a display area DA of a display device according to an exemplary embodiment of the present invention will be described with reference to FIG. 28 to FIG. 30.

Figure 28:
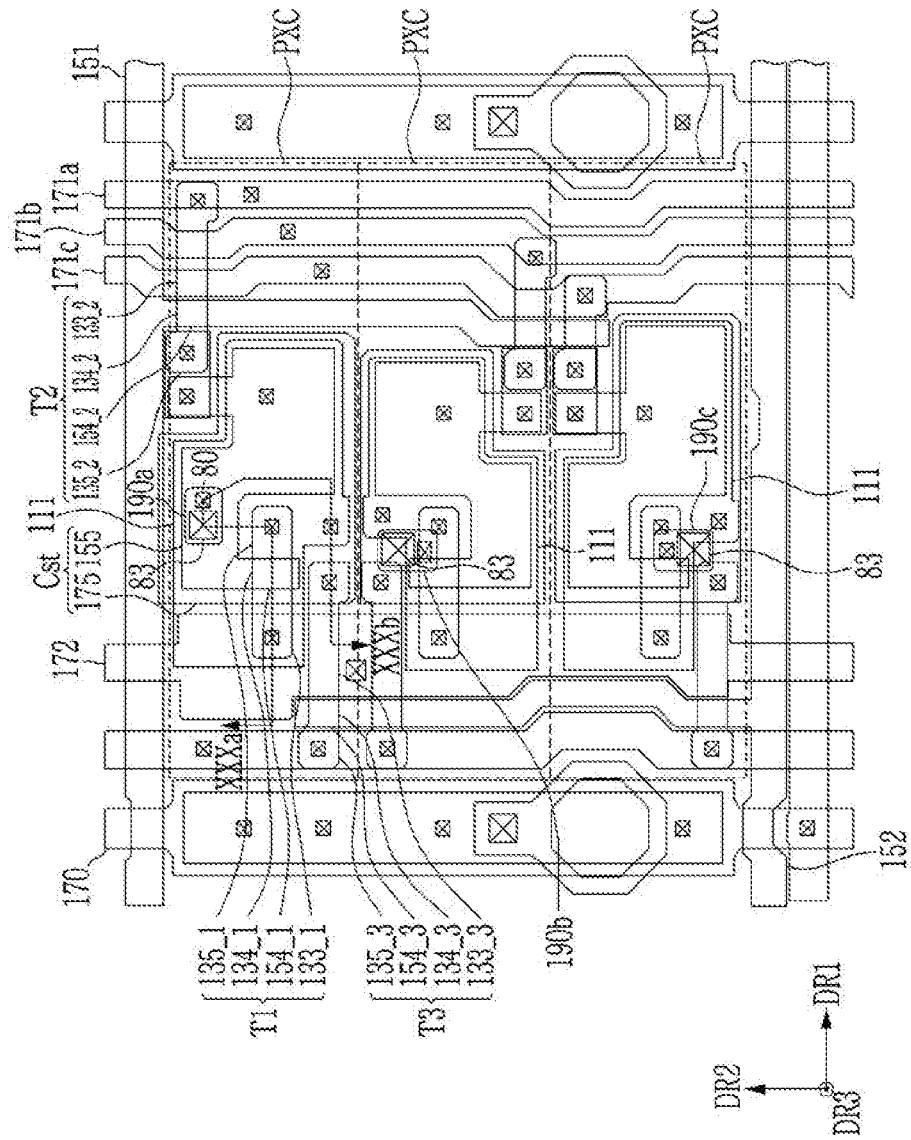
FIG. 28 is a planar layout view of a plurality of pixels of a display device according to an exemplary embodiment of the present invention.
Figure 29:
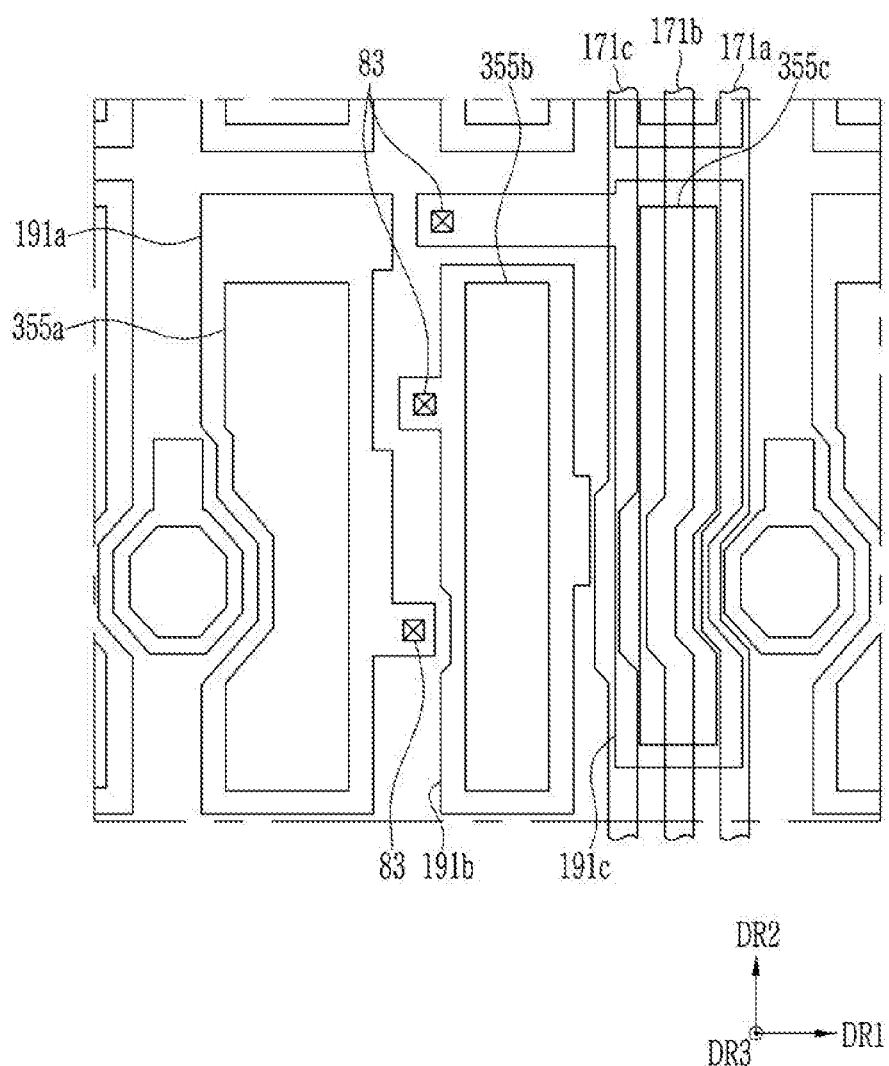
FIG. 29 is a planar layout view of a pixel electrode and a plurality of data lines of the display device according to an exemplary embodiment of the present invention.
Figure 30:
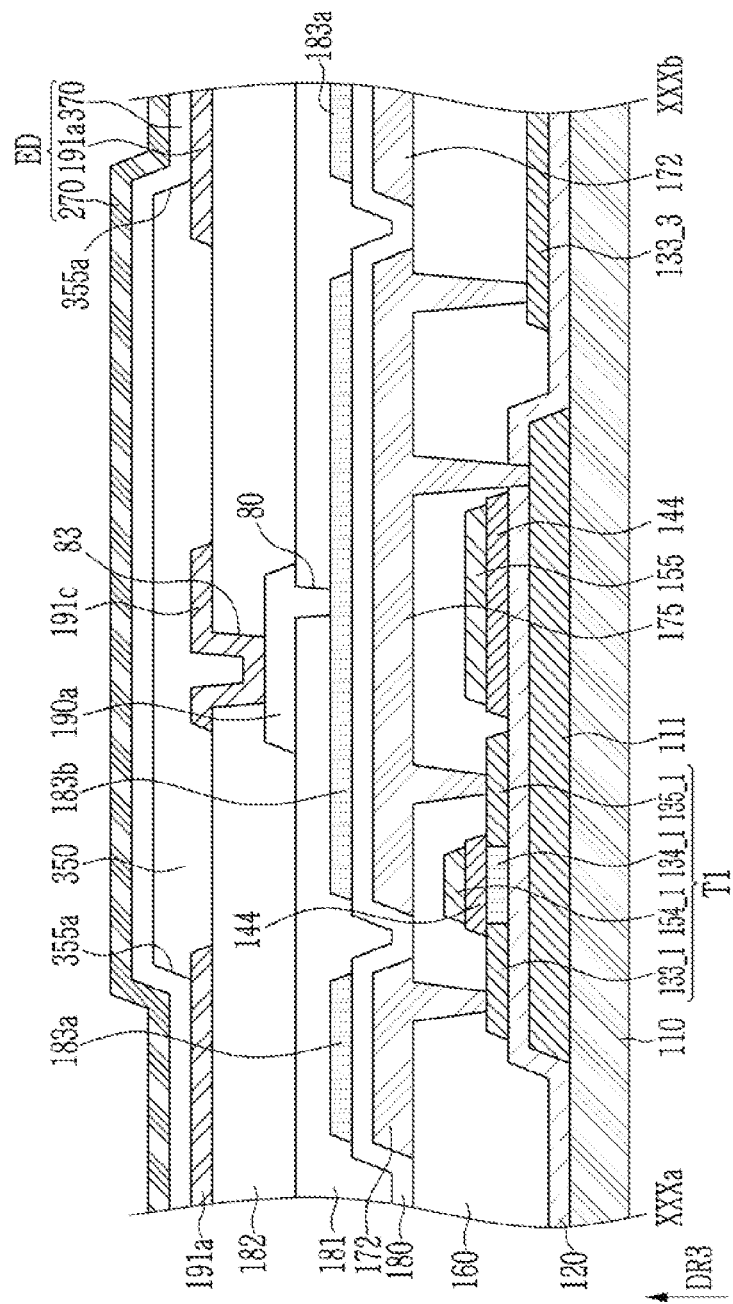
FIG. 30 is a cross-sectional view of the display device of FIG. 28, taken along line XXXa-XXXb.

FIG. 28 is a planar layout view of a plurality of pixels of a display device according to an exemplary embodiment of the present invention, FIG. 29 is a planar layout view of a pixel electrode and a plurality of data lines of the display device according to the exemplary embodiment of the present invention, and FIG. 30 is a cross-sectional view of the display device of FIG. 28, taken along line XXXa-XXXb.

The same description of the same constituent elements as the exemplary embodiment described above will be omitted, and the description will be focused on differences or additions.

A display device according to the present exemplary embodiment is a light emitting display device, and referring to FIG. 28, each pixel may include a pixel circuit portion PXC including a plurality of transistors T1, T2, and T3. A plurality of pixel circuit portions PXC corresponding to the plurality of pixels may be arranged in a second direction DR2.

Referring to FIG. 28 and FIG. 30, a plurality of lower patterns 111 may be disposed on a substrate 110. The lower pattern 111 may include a semiconductor material having various conductive metals or similar conductivity characteristics.

A buffer layer 120 is disposed on the lower patterns 111, and a plurality of active patterns corresponding to each of the transistors T1, T2, and T3 may be disposed on the buffer layer 120. The active patterns of the first transistor T1 may include a channel region 134_1, a source region 133_1, and a drain region 135_1. The active patterns of the second transistor T2 may include a channel region 134_2, a source region 133_2, and a drain region 135_2. The active patterns of the third transistor T3 may include a channel region 134_3, a source region 133_3, and a drain region 135_3.

Each of the plurality of transistors T1, T2, and T3 may include the same structure as the above-described pixel transistor, and the plurality of active patterns included in each of the transistors T1, T2, and T3 may have the same characteristics as the above-described active patterns 131a.

A gate insulation layer 144 may be disposed on the active patterns. The gate insulation layer 144 may be the same as the gate insulation layer 144a described above.

Scan lines 151 and 152 that transmit a gate signal, and a plurality of gate electrodes 154_1, 154_2, 154_3, and 155 may be disposed on the gate insulation layer 144. Each of the scan lines 151 and 152 may extend substantially in a first direction DR1. The scan lines 151 and 152 may be same as the above-described gate lines 121.

The gate electrode 155 is disposed corresponding to each pixel circuit portion PXC and may be electrically connected with the gate electrode 154_1. The gate electrode 154_2 extends substantially in a second direction DR2 and thus may be electrically connected with the scan line 151. The gate electrode 154_3 extends substantially in the second direction DR2 and thus may be electrically connected with the scan line 152.

An insulation layer 160 may be disposed on the scan lines 151 and 152 and the gate electrodes 154_1, 154_2, 154_3, and 155.

A plurality of data lines 171a, 171b, and 171c, a driving voltage line 172, a common voltage line 170, and a capacitor electrode 175 may be disposed on the insulation layer 160.

Each of the plurality of data lines 171a, 171b, and 171c extends substantially in the second direction DR2, and each of the data lines 171a, 171b, and 171c may be electrically connected with a source region 133_2 of the second transistor T2 through an opening of the insulation layer 160. The data lines 171a, 171b, and 171c may be the same as the above-described data lines 171.

The driving voltage line 172 may be electrically connected with a source region 133_1 of the first transistor T1 through the opening of the insulation layer 160.

A single capacitor electrode 175 may be disposed in each pixel circuit PXC, and may form a capacitor Cst by overlapping a corresponding gate electrode 155, while disposing the insulation layer 160 therebetween. The capacitor electrode 175 may be electrically connected with a drain region 135_1 of the first transistor T1 and a source region 133_3 of the third transistor T3 through the opening of the insulation layer 160, and may be electrically connected with the lower patterns 111 through the opening of the insulation layer 160 and the buffer layer 120.

The first transistor T1 includes a channel region 134_1, a source region 133_1, a drain region 135_1, and a gate electrode 154_1.

The second transistor T2 includes a channel region 134_2, a source region 133_2, a drain region 135_2, and a gate electrode 154_2. The drain region 135_2 of the second transistor T2 may be electrically connected with the gate electrode 154_1 through the gate electrode 155.

The third transistor T3 includes a channel region 134_3, a source region 133_3, a drain region 135_3, and a third gate electrode 154_3.

An insulation layer 180 is disposed on the data lines 171a, 171b, and 171c, the driving voltage line 172, the common voltage line 170, and the capacitor electrode 175, and a plurality of conductive patterns 183a and 183b may be disposed on the insulation layer 180. The conductive patterns 183a and 183b may be electrically connected with the data lines 171a, 171b, and 171c, the driving voltage line 172, the common voltage line 170, and the capacitor electrode 175 disposed therebelow, and may have substantially similar planar shapes as the data lines 171a, 171b, and 171c, the driving voltage line 172, the common voltage line 170, and the capacitor electrode 175.

An insulation layer 181 may be disposed on the conductive patterns 183a and 183b. The insulation layer 181 may include an opening 80 disposed on the conductive pattern 183b that is connected with the capacitor electrode 175.

A plurality of conductive ohmic contact members 190a, 190b, and 190c may be disposed on the insulation layer 181.

Each of the ohmic contact members 190a, 190b, and 190c may be electrically connected with the conductive pattern 183b while contacting the conductive pattern 183b through the opening 80 in each pixel circuit portion PXC.

An insulation layer 182 may be disposed on the ohmic contact members 190a, 190b, and 190c. The insulation layer 182 may include an opening 83 that is disposed on each of the ohmic contact members 190a, 190b, and 190c.

Referring to FIG. 29 and FIG. 30, a plurality of pixel electrodes 191a, 191b, and 191c may be disposed on the insulation layer 182. In a plan view, the plurality of pixel electrodes 191a, 191b, and 191c may be arranged in the first direction DR1. However, the layout and the structure of the pixel circuit portions PXC and the pixel electrodes 191a, 191b, and 191c are not limited thereto.

The plurality of pixel electrodes 191a, 191b, and 191c may be electrically connected with the ohmic contact members 190a, 190b, and 190c that are electrically connected with the capacitor electrode 175 through an opening 83 of the insulation layer 182. Each of the pixel electrodes 191a, 191b, and 191c may receive a data voltage by being electrically connected with the drain region 135_1 of the first transistor T1 via the conductive pattern 183b and the capacitive electrode 175.

The pixel electrodes 191a, 191b, and 191c may include a transflective conducting material or a reflective conducting material.

An insulation layer 350 may be disposed on the insulation layer 182. Referring to FIG. 29 and FIG. 30, the insulation layer 350 may include openings 355a, 355b, and 355c, respectively disposed on the pixel electrodes 191a, 191b, and 191c. The insulation layer 350 may include organic insulating materials such as polyacryl-based resins and polyimide resins.

An emission layer 370 may be disposed on the insulation layer 350 and the pixel electrodes 191a, 191b, and 191c. The emission layer 370 may include a portion disposed inside the openings 355a, 355b, and 355c of the insulation layer 350. The emission layer 370 may include an organic light emitting material or an inorganic light emitting material.

A common electrode 270 is disposed on the emission layer 370. The common electrode 270 is electrically connected with the common voltage line 170 and thus may receive a common voltage. The common electrode 270 may include a conductive transparent material.

The respective pixel electrodes 191a, 191b, and 191c, the emission layer 370, and the common electrode 270 form a light emitting diode ED, and one of the pixel electrodes 191a, 191b, and 191c and the common electrode 270 become a cathode and the other may be an anode. In a plan view, areas where the openings 355a, 355b, and 355c of the insulation layer 350 are formed may define a light emission area of each pixel.

In the present exemplary embodiment, at least one of the insulation layers 180, 181, and 182, the conductive patterns 183a and 183b, and the ohmic contact members 190a, 190b, and 190c, may be omitted.

While the invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the disclosure.

What is claimed is:

1. A display device comprising:
a substrate comprising a display area and a peripheral area surrounding the display area;
a plurality of pixel circuit portions and a plurality of signal lines disposed in the display area; and
a driving circuit portion disposed in the peripheral area and connected with the plurality of signal lines,
wherein the driving circuit portion comprises a first transistor including a first active pattern disposed on the substrate, a first gate insulation layer disposed on the first active pattern, a first gate electrode disposed on the first gate insulation layer,
wherein each pixel circuit portion comprises a second transistor including a second active pattern disposed on the substrate, a second gate insulation layer disposed on the second active pattern, and a second gate electrode disposed on the second gate insulation layer,
wherein the first gate insulation layer comprises a first outer portion that does not overlap the first gate electrode in a first direction and is adjacent to a first edge of the first gate electrode but overlaps a first channel region of the first active pattern in the first direction,
wherein the second gate insulation layer comprises a second outer portion that does not overlap the second gate electrode in the first direction and is adjacent to a second edge of the second gate electrode but overlaps a second channel region of the second active pattern in the first direction,
wherein an insulation layer is disposed on the first gate electrode and the second gate electrode,
wherein the insulation layer has a first opening on the first active pattern, and a second opening on the second active pattern,
wherein the first outer portion has a first lateral side spaced apart from the first opening, and the insulating layer fills in a space between the first lateral side and the first opening,
wherein the second outer portion has a second lateral side spaced apart from the second opening, and the insulating layer fills in a space between the second lateral side and the second opening,
wherein a first maximum width of the first outer portion in a second direction different from the first direction measured from the first edge of the first gate electrode to the first lateral side is larger than a second maximum width of the second outer portion in the second direction measured from the second edge of the second gate electrode to the second lateral side.

2. The display device of claim 1, wherein the first outer portion has a shape extending along a periphery of the first gate electrode, and the second outer portion has a shape extending along a periphery of the second gate electrode.

3. The display device of claim 1, wherein a width of the first outer portion is greater than or equal approximately 1.7 micrometers.

4. The display device of claim 1, wherein the first active pattern comprises the first channel region overlapping the first gate electrode, a first source region, and a first drain region, the first source region and the first drain region facing each other with respect to the first channel region, the second active pattern comprises the second channel region overlapping the second gate electrode, a second source region, and a second drain region, the second source region and the second drain region facing each other with respect to the second channel region, and a distance between the first drain region and the first gate electrode is larger than a distance between the second drain region and the second gate electrode.

5. The display device of claim 4, further comprising:
a first source electrode that is disposed on the insulation layer and electrically connected with the first source region; and
a first drain electrode that is disposed on the insulation layer and electrically connected with the first drain region.

6. The display device of claim 1, wherein the display area comprises a plurality of pixels, and each of the plurality of pixels comprises a corresponding one of the plurality of pixel circuit portions and a light emitting diode electrically connected with the corresponding pixel circuit portion.

7. The display device of claim 6, wherein the plurality of signal lines comprise a plurality of gate lines that are electrically connected with the plurality of pixel circuit portions, and the driving circuit portion is connected with the plurality of gate lines and applies gate signals to the plurality of gate lines while scanning the plurality of gate lines.

8. A display device comprising:
a substrate comprising a display area and a peripheral area surrounding the display area;
a plurality of pixel circuit portions and a plurality of signal lines disposed in the display area; and
a driving circuit portion disposed in the peripheral area and connected with the plurality of signal lines, wherein the driving circuit portion comprises a first transistor including a first active pattern disposed on the substrate, a first gate insulation layer disposed on the first active pattern, and a first gate electrode disposed on the first gate insulation layer,
wherein the first gate insulation layer comprises a first outer portion that does not overlap the first gate electrode in a first direction,
wherein the first outer portion comprises a first portion adjacent to a first side edge of the first gate electrode and a second portion adjacent to a second side edge of the first gate electrode that opposes the first side edge, the first portion has a lateral side spaced apart from a first opening, and the second portion has a lateral side spaced apart from a second opening,
wherein the first portion has a first lateral side spaced apart from the first opening, and the insulating layer fills in a space between the first lateral side and the first opening,
wherein the second portion has a second lateral side spaced apart from the second opening, and the insulating layer fills in a space between the second lateral side and the second opening,
where a maximum width of the first portion in a second direction different from the first direction measured from the first side edge of the first gate electrode to the first lateral side is different from a maximum width of the second portion in the second direction measured from the second side edge of the first gate electrode to the second lateral side.

9. The display device of claim 8, wherein the first active pattern comprises a first channel region overlapping the gate electrode, a first source region, and a first drain region, the first source region and the first drain region facing each other with reference to the first channel region, the first outer portion comprises a first part overlapping the first source region and a second part overlapping the first drain region, and a width of the second part is larger than a width of the first part.

10. The display device of claim 9, further comprising:
an insulation layer that is disposed on the first gate electrode;
a first source electrode disposed on the insulation layer and electrically connected with the first source region; and
a first drain electrode disposed on the insulation layer and electrically connected with the first drain region.

11. The display device of claim 8, wherein the first outer portion has a shape extending along a periphery of the first gate electrode in a plan view.

12. The display device of claim 8, wherein each of the pixel circuit portions comprises a second transistor, wherein the second transistor comprises:
a second active pattern disposed on the substrate, a second gate insulation layer disposed on the second active pattern; and
a second gate electrode disposed on the second gate insulation layer, wherein the second gate insulation layer comprises a second outer portion that does not overlap the second gate electrode in the first direction, and
wherein the second outer portion has a shape extending along a periphery of the second gate electrode.

13. The display device of claim 12, wherein the display area comprises a plurality of pixels, and each of the plurality of pixels comprises a corresponding one of the plurality of pixel circuit portions and a light emitting diode electrically connected with the corresponding pixel circuit portion.

14. A display device comprising:
a substrate comprising a display area and a peripheral area surrounding the display area;
a plurality of pixel circuit portions and a plurality of signal lines disposed in the display area; and
a driving circuit portion disposed in the peripheral area and connected with the plurality of signal lines,
wherein the driving circuit portion comprises a first transistor including a first active pattern disposed on the substrate, a first gate insulation layer that is disposed on the first active pattern, a first gate electrode extending in a first direction and disposed on the first gate insulation layer, a dummy insulation layer spaced apart from the first gate insulation layer on the first active pattern, and a dummy electrode extending in a first direction and disposed on the dummy insulation layer and spaced apart from the first gate electrode in the first direction and on the first active pattern,
wherein the dummy electrode comprises a same material as the first gate electrode and has a maximum width smaller than a maximum width of the first gate electrode, and wherein the dummy insulation layer comprises a same material as the first gate insulation layer and has a maximum width smaller than a maximum width of the first gate insulation layer,
wherein the first gate electrode and the dummy electrode are disposed between a source electrode of the first transistor connected to the first active pattern and a drain electrode of the first transistor connected to the first active pattern,
wherein the first gate insulation layer and the dummy insulation layer are spaced apart from one another in the first direction, and an additional insulation layer is disposed in a gap between the first gate insulation layer and the dummy insulation layer.

15. The display device of claim 14, wherein the first active pattern comprises a first channel region overlapping the first gate electrode, a first source region, a second drain region, a dummy channel region, and a dummy drain region, the first source region and the first drain region facing each other with respect to the first channel region, the dummy channel region and the dummy drain region disposed between the first channel region and the first drain region, the dummy electrode overlaps the dummy channel region, and the dummy drain region is disposed between the dummy channel region and the first channel region.

16. The display device of claim 14, wherein the first gate insulation layer comprises a first outer portion that does not overlap the first gate electrode in a direction that is perpendicular to a top surface of the substrate, and the first outer portion has a shape extending along a periphery of the first gate electrode.

17. The display device of claim 14, wherein each of the pixel circuit portions comprises a second transistor, wherein the second transistor comprises:

a second active pattern disposed on the substrate, a second gate insulation layer disposed on the second active pattern; and a second gate electrode disposed on the second gate insulation layer, wherein the second gate insulation layer comprises a second outer portion that does not overlap the second gate electrode in the direction that is perpendicular to the top surface of the substrate, and wherein the second outer portion has a shape extending along a periphery of the second gate electrode.

18. The display device of claim 14, wherein the dummy electrode is electrically connected with the first gate electrode.

19. The display device of claim 14, wherein the dummy electrode is insulated from the first gate electrode and floated.

20. The display device of claim 8, wherein the first outer portion overlaps a channel region of the first gate electrode in the first direction.

* * * * *